US012593501B2

(12) United States Patent
Xie et al.

(10) Patent No.: US 12,593,501 B2
(45) Date of Patent: Mar. 31, 2026

(54) STACKED FORK SHEET DEVICES

(71) Applicant: International Business Machines Corporation, Armonk, NY (US)

(72) Inventors: Ruilong Xie, Niskayuna, NY (US); Julien Frougier, Albany, NY (US); Brent A. Anderson, Jericho, VT (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 648 days.

(21) Appl. No.: 17/900,047

(22) Filed: Aug. 31, 2022

(65) Prior Publication Data

US 2024/0072047 A1 Feb. 29, 2024

(51) Int. Cl.

*H10D 84/83* (2025.01)
*H01L 23/528* (2006.01)
*H10D 30/67* (2025.01)
*H10D 62/10* (2025.01)
*H10D 64/23* (2025.01)

(52) U.S. Cl.

CPC ......... *H10D 84/83* (2025.01); *H01L 23/5286* (2013.01); *H10D 30/6735* (2025.01); *H10D 30/6757* (2025.01); *H10D 62/121* (2025.01); *H10D 64/251* (2025.01)

(58) Field of Classification Search

CPC ............... H10D 84/83; H10D 30/6735; H10D 30/6757; H10D 62/121; H10D 64/251; H10D 30/014; H10D 30/43; H10D 84/0149; H10D 84/0153; H10D 84/0186; H10D 84/038; H10D 84/85; H10D 88/00; H10D 88/01; H01L 23/5286; H01L 21/76895; H01L 21/76897; H01L 21/76898

See application file for complete search history.

(56) References Cited

U.S. PATENT DOCUMENTS 11,239,236 B2 2/2022 Lilak et al.
12,087,770 B2 9/2024 Xie et al.
(Continued)

OTHER PUBLICATIONS

Ryckaert, J., et al., "From Design to System-Technology optimization for CMOS", 2021 International Symposium on VLSI Technology, Systems and Applications, Date of Conference: Apr. 1-22, 2021, 2 pages.

(Continued)

*Primary Examiner* — Mohammad A Rahman
(74) *Attorney, Agent, or Firm* — Scully, Scott, Murphy & Presser, P.C.; L. Jeffrey Kelly, Esq.

(57) ABSTRACT

A semiconductor structure is provided that includes a first pair of stacked devices located in a first active device region and a second pair of stacked devices located in a second active device region. Each stacked device of the pair of stacked devices includes a second field effect transistor (FET) stacked over a first FET, and within each active device region the pair of stacked devices is separated by an inter-device dielectric pillar. A local interconnect structure is located in a non-active device region that is positioned between the first and second active device regions. The local interconnect structure can be connected to a back side power rail and a source/drain region of one of the second FETs, or connected to a front side signal line and a source/drain region of one of the first FETs.

20 Claims, 25 Drawing Sheets

(56) References Cited

U.S. PATENT DOCUMENTS

| | | | |
|---|---|---|---|
| 2021/0193821 A1 | 6/2021 | Dentoni Litta et al. | |
| 2021/0376076 A1 | 12/2021 | Su et al. | |
| 2021/0407999 A1 | 12/2021 | Huang et al. | |
| 2022/0093647 A1 | 3/2022 | Sung et al. | |
| 2022/0139914 A1 | 5/2022 | Cheng et al. | |
| 2023/0345693 A1* | 10/2023 | Wang | H10D 89/10 |

OTHER PUBLICATIONS

Chen, R., et al.,"Design and Optimization of SRAM Macro and Logic Using Backside Interconnects at 2nm node", 2021 IEEE International Electron Devices Meeting (IEDM), Date of Conference: Dec. 11-16, 2021, 4 pages.

* cited by examiner 28
18
47
62
36
38
42
54
48
16
47
63
100
60
56
49L
52
64
66
104
54S
102

16
20C
18
26C
63
61
28
34
48
47
100
64
58
49
66
104
102

STACKED FORK SHEET DEVICES

BACKGROUND

The present application relates to semiconductor technology, and more particularly to a semiconductor structure including stacked devices (e.g., fork sheet devices) located in different device regions that are separated by a non-active device region including a local interconnect structure.

Fork sheet devices have recently been proposed as a natural extension of vertically stacked lateral gate-all-around (GAA) nanosheet devices. Contrary to the GAA nanosheet device, in the fork sheet device, the nanosheets are now controlled by a tri-gate forked structure, realized by introducing a dielectric pillar (i.e., dielectric wall) attached to at least one of vertical edges of the semiconductor channel material fork sheets. The dielectric pillar can be formed between the pFET and nFET devices. The dielectric pillar physically isolates the pFET active device region from the nFET active device region, allowing a much tighter n-to-p spacing. Alternatively, the dielectric pillar can also be formed at cell boundaries (i.e., between pFET and pFET devices, or between nFET and nFET devices) allowing a much tighter p-to-p or n-to-n spacing. Because of this reduced n-to-p (or n-to-n, or p-to-p) separation, the fork sheet device has superior area and performance scalability as compared to FinFET or nanosheet structures. Stacked fork sheet devices can provide two stacked FETs on each side of the dielectric pillar allowing for high cell density.

SUMMARY

A semiconductor structure is provided that includes a first pair of stacked devices located in a first active device region and a second pair of stacked devices located in a second active device region.

Each stacked device of the pair of stacked devices includes a second field effect transistor (FET) stacked over a first FET, and within each active device region the pair of stacked devices is separated by an inter-device dielectric pillar. A local interconnect structure is located in a non-active device region that is positioned between the first and second active device regions. The local interconnect structure can be connected to a back side power rail and a source/drain region of one of the second FETs, or connected to a front side signal line and a source/drain region of one of the first FETs.

In one aspect of the present application, a semiconductor structure is provided. In one embodiment, the semiconductor structure includes a first pair of stacked devices that are located in a first active device region, wherein the first pair of stacked devices are separated by a first inter-device dielectric pillar and each stacked device of the first pair of stacked devices includes a second field effect transistor (FET) stacked over a first FET. The structure further includes a second pair of stacked devices that are located in a second active device region, wherein the second pair of stacked devices are separated by a second inter-device dielectric pillar and each stacked device of the second pair of stacked devices includes a second FET stacked over a first FET. The structure even further includes a local interconnect structure located in a non-active device region that is positioned between the first active device region and the second active device region, wherein the local interconnect structure is connected to a back side power distribution network and to a source/drain region of the second FET of the second pair of stacked devices that is located on a first side of the second inter-device dielectric pillar that is closest to the non-active device region.

In another embodiment, the semiconductor structure includes a first pair of stacked devices that are located in a first active device region, wherein the first pair of stacked devices are separated by a first inter-device dielectric pillar and each stacked device of the first pair of stacked devices includes a second field effect transistor (FET) stacked over a first FET. The structure further includes a second pair of stacked devices that are located in a second active device region, wherein the second pair of stacked devices are separated by a second inter-device dielectric pillar and each stacked device of the second pair of stacked devices includes a second FET stacked over a first FET. The structure further includes a local interconnect structure located in a non-active device region that is positioned between the first active device region and the second active device region, wherein the local interconnect structure is connected to a front side signal line and to a source/drain region of the first FET of the second pair of stacked devices that is located on a first side of the second inter-device dielectric pillar that is closest to the non-active device region.

In another aspect of the present application, a method of forming a semiconductor structure is provided. The method of the present application will be apparent from the following detail description.

DETAILED DESCRIPTION

Figure 1:
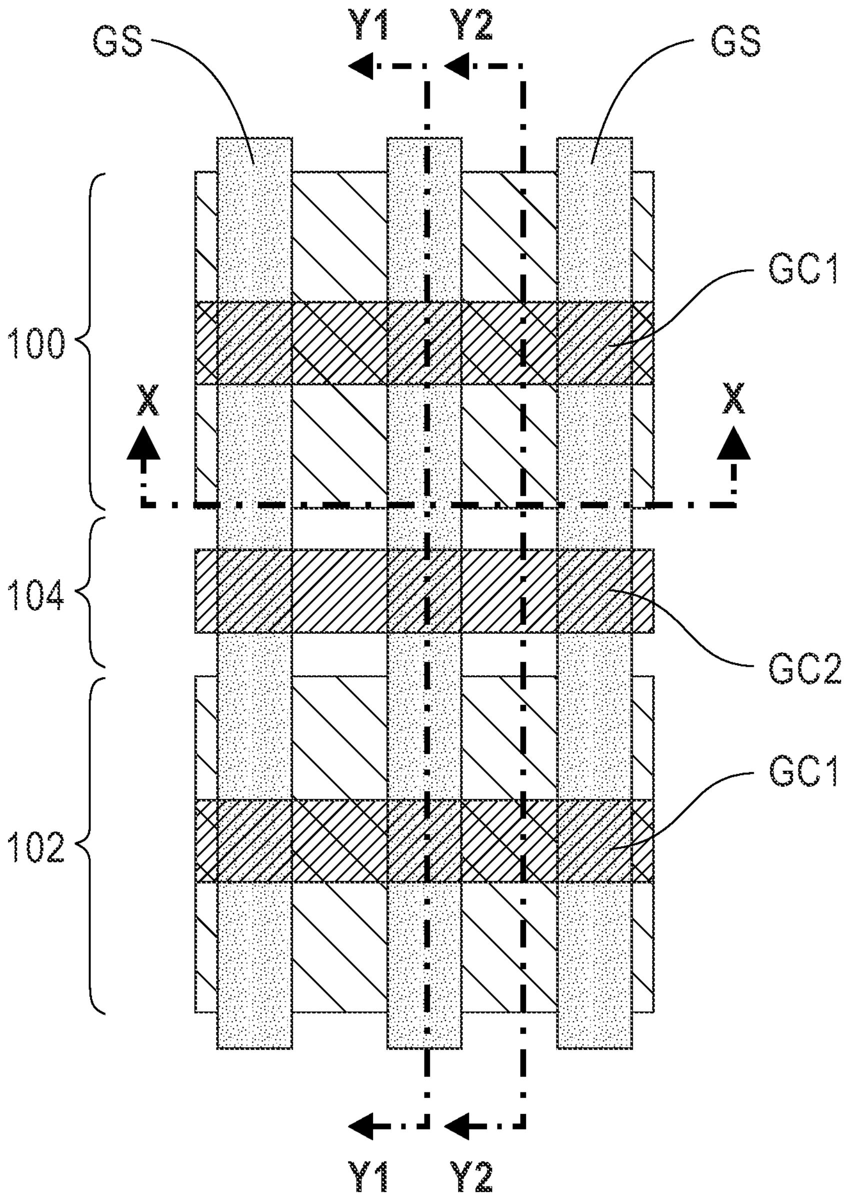
FIG. 1 is a top down view illustrating a device layout that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a top down view of an exemplary semiconductor device layout that can be employed in accordance with an embodiment of the present application. The illustrated semiconductor device layout includes a first active device region 100 and a second active device region 102 that are spaced apart from each other by a non-active device region 104. Each of the first and second active device regions 100, 102 includes a plurality of functional gate structures, GS, which are oriented parallel to each other, and cut by an inter-device cut gate region, GC1; GC1 will include the inter-device dielectric pillars of the stacked fork sheet devices. The non-active device region 104 includes external device gate cut region, GC2; will eventually include external device dielectric pillar. The semiconductor device layout illustrated in FIG. 1 will be used to describe the semiconductor structure of the present application. FIG. 1 includes a cut X-X which is along an edge of the first active device region 100 and the non-active device region 104. FIG. 1 also includes cut Y1-Y1 which is along the length wise direction of the gate structures, GS, and through one of the gate structures, GS. FIG. 1 further includes a cut Y2-Y2 which is along the length wise direction of the gate structures and in an area (i.e., a source/drain area) between two adjacent gate structures, GS.

Figure 2B:
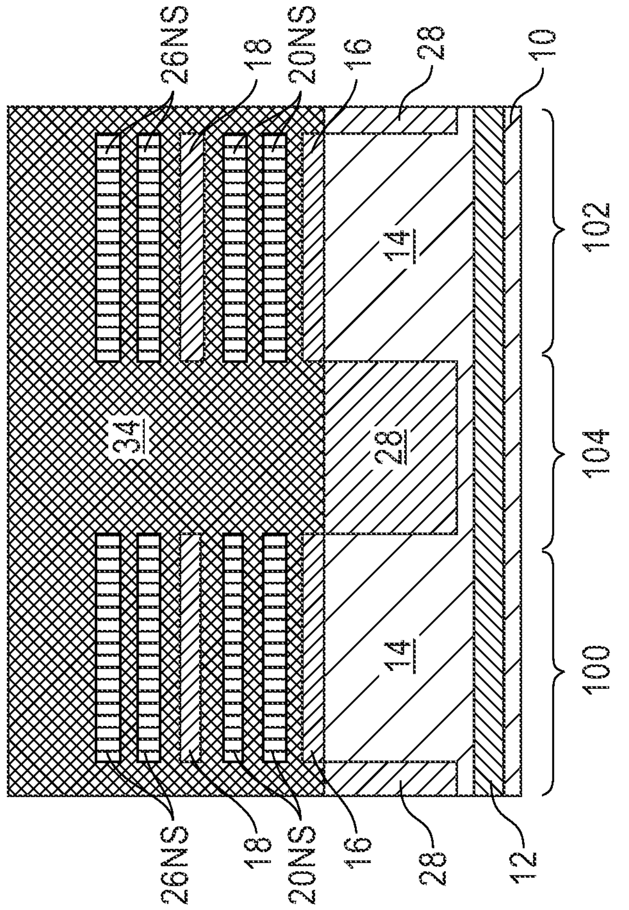
FIGS. 2A-2B are cross sectional views of an exemplary structure through X-X and Y1-Y1 shown in FIG. 1, respectively, that can be employed in the present application, the exemplary structure including at least a pair of stacked nano sheet devices located on a bottom dielectric isolation layer that is positioned on a semiconductor substrate, each stacked nanosheet device includes a functional gate structure wrapped around a plurality of first semiconductor channel material nanosheets, a plurality of second semiconductor channel material nanosheets, and a middle dielectric isolation layer that separates the plurality of first semiconductor channel material nanosheets and the plurality of second semiconductor channel material nanosheets, the nanosheet devices further include a first source/drain region extending from a sidewall of each of the first semiconductor channel material nanosheets and located on a placeholder material layer that is located in an upper portion of the semiconductor substrate, and a second source/drain region extending from a sidewall of each of the second semiconductor channel material nanosheets and spaced apart from the first source/drain region by a source/drain dielectric isolation layer, and wherein a first interlayer dielectric (ILD) material layer is located on the second source/drain region.
Figure 2A:
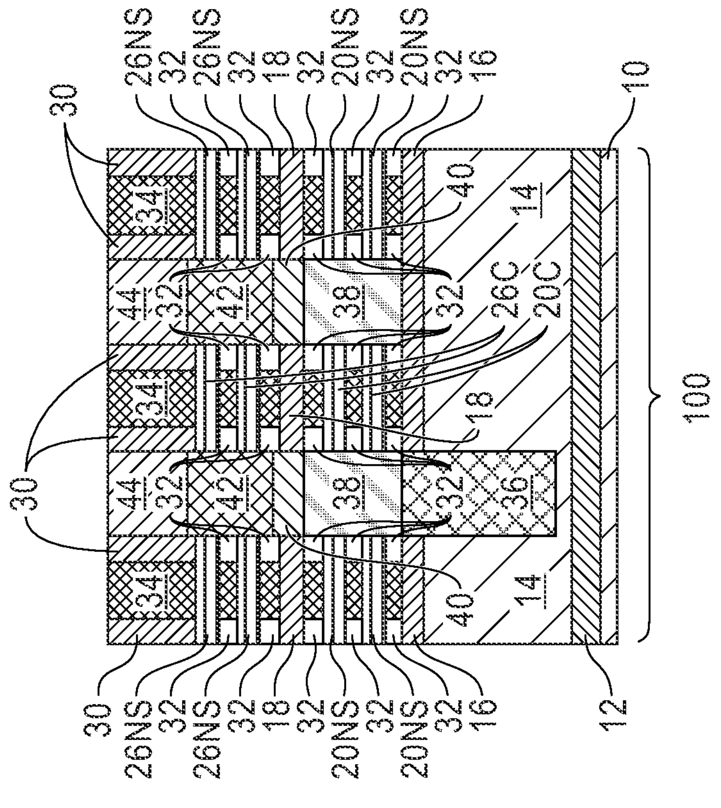

Reference is now made to FIGS. 2A-2B which are cross sectional views of an exemplary structure through X-X and Y1-Y1 shown in FIG. 1, respectively that can be employed in the present application. FIG. 2A shows only the first active device region 100, while FIG. 2B shows the first active device region 100, the non-active device region 104 and the second active device region 102 along the Y1-Y1 cut.

The exemplary structure illustrated in FIGS. 2A-2B includes at least a pair of stacked nanosheet devices (three are shown by way of one example in FIG. 2A) located on a bottom dielectric isolation layer 16 that is positioned on a semiconductor substrate 10/12/14. Each stacked nanosheet device includes a functional gate structure 34 wrapped around a plurality of first semiconductor channel material nanosheets 20NS, a plurality of second semiconductor channel material nanosheets 26NS, and a middle dielectric isolation layer 18 that separates the plurality of first semiconductor channel material nanosheets 20NS and the plurality of second semiconductor channel material nanosheets 26NS. The stacked nanosheet devices further include a first source/drain region 38 extending from a sidewall of each of the first semiconductor channel material nanosheets 20NS and located on placeholder material layer 36 that is located in an upper portion of the semiconductor substrate 10/12/14, and a second source/drain region 42 extending from a sidewall of each of the second semiconductor channel material nanosheets 26NS and spaced apart from the first source/drain region 38 by a source/drain dielectric isolation layer 40. The structure illustrated in FIGS. 2A-2B further includes a first interlayer dielectric (ILD) material layer 44 located on the second source/drain region 42, dielectric spacer 30 located laterally adjacent to an upper portion of each functional gate structure 34 and inner dielectric spacers 32 which are located between each first and second semiconductor channel material nanosheets 20NS and 26NS, as well as between the bottommost first semiconductor channel material nanosheet 20NS and the bottom dielectric isolation layer 16 and between the bottommost second semiconductor channel material nanosheet 26NS and the middle dielectric isolation layer 18. The structure illustrated in FIGS. 2A-2B further includes a shallow trench isolation structure 28 that laterally surrounds a non-recessed portion of the second semiconductor material layer 14.

The semiconductor substrate includes a first semiconductor material layer 10, an etch stop layer 12 and a second semiconductor material layer 14. The first semiconductor material layer 10 of the semiconductor substrate is composed of a first semiconductor material having semiconducting properties. Examples of first semiconductor materials that can be used to provide the first semiconductor material layer 10 include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material layer 14 of the semiconductor substrate is composed of a second semiconductor material. The second semiconductor material that provides the second semiconductor material layer 14 can be compositionally the same as, or compositionally different from the first semiconductor material that provides the first semiconductor material layer 10. In some embodiments of the present application, the etch stop layer 12 can be composed of a dielectric material such as, for example, silicon dioxide and/or boron nitride. In other embodiments of the present application, the etch stop layer 12 is composed of a semiconductor material that is compositionally different from the semiconductor material that provides both the first semiconductor material layer 10 and the second semiconductor material layer 14. In one example, the first semiconductor material layer 10 is composed of silicon, the etch stop layer 12 is composed of silicon dioxide, and the second semiconductor material layer 14 is composed of silicon. Such a semiconductor substrate including silicon/silicon dioxide/silicon can be referred to as a silicon-on-insulator (SOI) substrate. In another example, the first semiconductor material layer 10 is composed of silicon, the etch stop layer 12 is composed of silicon germanium, and the second semiconductor material layer 14 is composed of silicon. Such a semiconductor substrate including silicon/silicon germanium/silicon can be referred to as a bulk semiconductor substrate.

Each first semiconductor channel material nanosheet 20NS is composed of one of the semiconductor materials mentioned above for the first semiconductor material layer 10 of the semiconductor substrate. The semiconductor material that provides each first semiconductor material nanosheet 20NS can be compositionally the same as, or compositionally different from, the second semiconductor material that provides the second semiconductor layer 14 of the semiconductor substrate. In some embodiments, each first semiconductor channel material nanosheet 20NS is composed of a semiconductor material capable of providing high channel mobility for nFET devices. In other embodiments, each first semiconductor channel material nanosheet 20NS is composed of a semiconductor material capable of providing high channel mobility for pFET devices. In one example, each first semiconductor material nanosheet 20NS is composed of silicon. In the present application, a plurality of first semiconductor material nanosheet 20NS are present.

Each second semiconductor channel material nanosheet 26NS is composed of one of the semiconductor materials mentioned above for the first semiconductor material layer 10 of the semiconductor substrate. The semiconductor material that provides each second semiconductor material nanosheet 26NS can be compositionally the same as, or compositionally different from, the second semiconductor material that is provides the second semiconductor layer 14 of the semiconductor substrate and/or the semiconductor material that provides each of the first semiconductor channel material nanosheets 20NS. In some embodiments, each second semiconductor channel material nanosheet 26NS is composed of a semiconductor material capable of providing high channel mobility for nFET devices. In other embodiments, each second semiconductor channel material nanosheet 26NS is composed of a semiconductor material capable of providing high channel mobility for pFET devices. In one example, each second semiconductor material nanosheet 26NS is composed of silicon. In the present application, a plurality of second semiconductor material nanosheet 26NS are present; the number of second semiconductor channel material nanosheets 26NS can be equal to, lesser than, or greater than, the number of first semiconductor channel material nanosheets 20NS.

Each first semiconductor channel material nanosheet 20NS and each second semiconductor material nanosheet 26NS can have a width from 10 nm to 130 nm, a length from 10 nm to 130 nm, and a vertical height from 4 nm to 20 nm. Other widths and/or lengths and/or vertical heights however can be used for each first semiconductor channel material nanosheet 20NS and each second semiconductor material nanosheet 26NS provided that the width and/or length and/or vertical height that are selected meet nanosheet specifications.

Each functional gate structure 34 (which at this point of the present application is uncut and is present in the first active device region 100, the non-active device region 104 and the second active device region 102) includes at least a gate dielectric material layer and a gate electrode; the gate dielectric material layer and the gate electrode are not separately illustrated in the drawings of the present application. As is known, the gate dielectric material layer of the functional gate structure 34 is in direct contact with each first semiconductor channel material nanosheet 20NS and each second semiconductor material nanosheet 26NS, and the gate electrode is located on the gate dielectric material layer;

the gate dielectric material also wraps the middle dielectric isolation layer 18. In some embodiments, the gate structure includes a work function metal (WFM) layer (not shown) located between the gate dielectric material layer and the gate electrode. In other embodiments, the WFM layer is used solely as the gate electrode.

The gate dielectric material layer of each functional gate structure 34 is composed of a gate dielectric material such as, for example silicon oxide, or a dielectric material having a dielectric constant greater than 4.0 (such dielectric materials can be referred to as a high-k gate dielectric material). All dielectric constants mentioned herein are measured in a vacuum unless otherwise stated. Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The high-k gate dielectric material can further include dopants such as lanthanum (La), aluminum (Al) and/or magnesium (Mg).

The gate electrode of each functional gate structure 34 can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_X$), titanium carbide (TiC), titanium aluminum carbide, tungsten silicide ($WSi_2$), tungsten nitride (WN), ruthenium oxide ($RuO_2$), cobalt silicide, or nickel silicide.

In some embodiments, a WFM layer can be employed as either the electrically conductive metal-containing material that provides the gate electrode or as a separate layer that is located between the gate dielectric material prior layer and the gate electrode. The WFM layer can be used to set a threshold voltage of the FET to a desired value. In some embodiments, the WFM layer can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM layer can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The dielectric spacer 30 is composed of a gate spacer dielectric material. Examples of gate spacer dielectric materials that can be used in providing the dielectric spacer 30 include, but are not limited to, SiN, SiBCN, SiOCN or SiOC.

The bottom dielectric isolation layer 16 and the middle dielectric isolation layer 18 are composed of one of the gate spacer dielectric materials mentioned above for dielectric spacer 30. The bottom dielectric isolation layer 16, the middle dielectric isolation layer 18 and the dielectric spacer 30 are typically formed at the same time, thus they are composed of a compositionally same gate spacer dielectric material. Each of the bottom dielectric isolation layer 16 and the middle dielectric isolation layer 18 can have a thickness from 5 nm to 50 nm; although other thicknesses for the bottom dielectric isolation layer 16 and the middle dielectric isolation layer 18 are contemplated and can be employed as the thickness of the bottom dielectric isolation layer 16 and the middle dielectric isolation layer 18.

The inner spacer 32 is composed one of the gate spacer dielectric materials mentioned above for dielectric spacer 30. The gate spacer dielectric material that provides the inner spacer 32 can be compositionally the same as, or compositionally different from, the gate dielectric spacer material that provides the dielectric spacer 30.

The shallow trench isolation structure 28 is composed of any trench dielectric material such as, for example, silicon oxide. In some embodiments, a trench dielectric material such as, for example, SiN can be present along a sidewall and a bottom wall of the trench dielectric material.

The first source/drain region 38 is composed of a semiconductor material and a first dopant. As used herein, a "source/drain or S/D" region can be a source region or a drain region depending on subsequent wiring and application of voltages during operation of the field effect transistor (FET). As is known, source/drain regions are located on each side of a gate structure. The semiconductor material that provides the first source/drain region 38 can include one of the semiconductor materials mentioned above for the first semiconductor material layer 10 of the semiconductor substrate. The semiconductor material that provides the first source/drain region 38 can be compositionally the same as, or compositionally different from, each first semiconductor channel material nanosheet 20NS. The first dopant that is present in the first source/drain region 38 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the first source/drain region 38 can have a dopant concentration of from $4\times10^{20}$ atoms/$cm^3$ to $3\times10^{21}$ atoms/$cm^3$.

The second source/drain region 42 is composed of a semiconductor material and a second dopant. The semiconductor material that provides the second source/drain region 42 can include one of the semiconductor materials mentioned above for the first semiconductor material layer 10 of the semiconductor substrate. The semiconductor material that provides the second source/drain region 42 can be compositionally the same as, or compositionally different from, each second semiconductor channel material nanosheet 26NS; the semiconductor material that provides the second source/drain region 42 can be compositionally the same as, or compositionally different from the semiconductor material that provides the first source/drain region 38. The second dopant that is present in the second source/drain region 42 can be of the same conductivity type as, or a different conductivity type than, the first dopant (i.e., either a p-type dopant or an n-type dopant as defined above). In one embodiment, the second dopant is of a different conductivity type than the first dopant such that the stacked nanosheet device includes a pFET device and an nFET device stacked in any order.

The placeholder material layer 36 is composed of any sacrificial material including a metal oxide such as, for example, $TiO_x$ or $AlO_x$, a metal nitride such as, for example, TiN or TaN, or a dielectric material such as, for example, SiCO or SiC or a combination of a SiN liner and $SiO_2$ fill, or semiconductor material that is different than the second semiconductor material layer 14, such as SiGe or III-V semiconductor materials. The placeholder material layer 36 has a first surface that contacts a sub-surface of the second semiconductor material layer 14 (the term "sub-surface" denotes a surface of a material that is located between a topmost surface of the material and a bottommost surface of the material), and a second surface that is opposite the first surface that extends above the topmost surface of the second semiconductor material layer 14 and directly contacts a bottommost surface of the first source/drain region 38. In some embodiments, and as is illustrated in FIG. 2A, the second surface of the placeholder material layer 36 is coplanar with a topmost surface of the bottom dielectric isolation layer 16.

The source/drain dielectric isolation layer 40 is composed of any dielectric material including for example, silicon dioxide, silicon nitride or one of the ILD materials mentioned below for the first front side ILD material layer 44. The source/drain dielectric isolation layer 40 is typically located laterally adjacent to the middle dielectric material layer 18.

The first front side ILD material layer 44, which is present on top of the second source/drain region 42, can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0.

The exemplary structure shown in FIGS. 2A-2B can be formed utilizing any well-known stacked nanosheet transistor formation process. So as not to obscure the method of the present application and the resultant structure that is formed by the method of the present application, the processing steps used in forming the exemplary structure shown in FIGS. 2A-2B are not described herein.

Figure 3A:
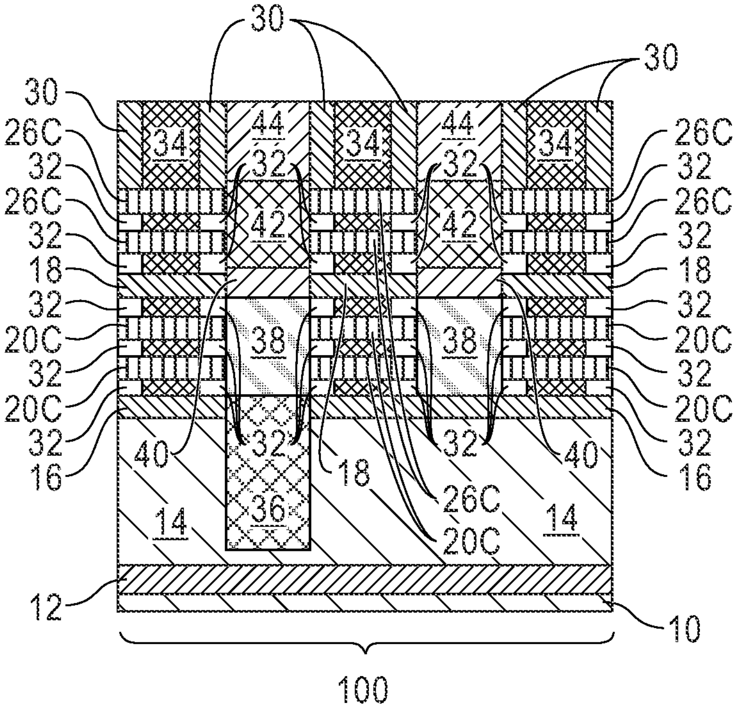
FIGS. 3A-3B are cross sectional views of the exemplary structure shown in FIGS. 2A-2B, respectively, after stacked FET gate cut patterning which provides inter-device gate cut trenches and an external device gate cut trench.
Figure 3C:
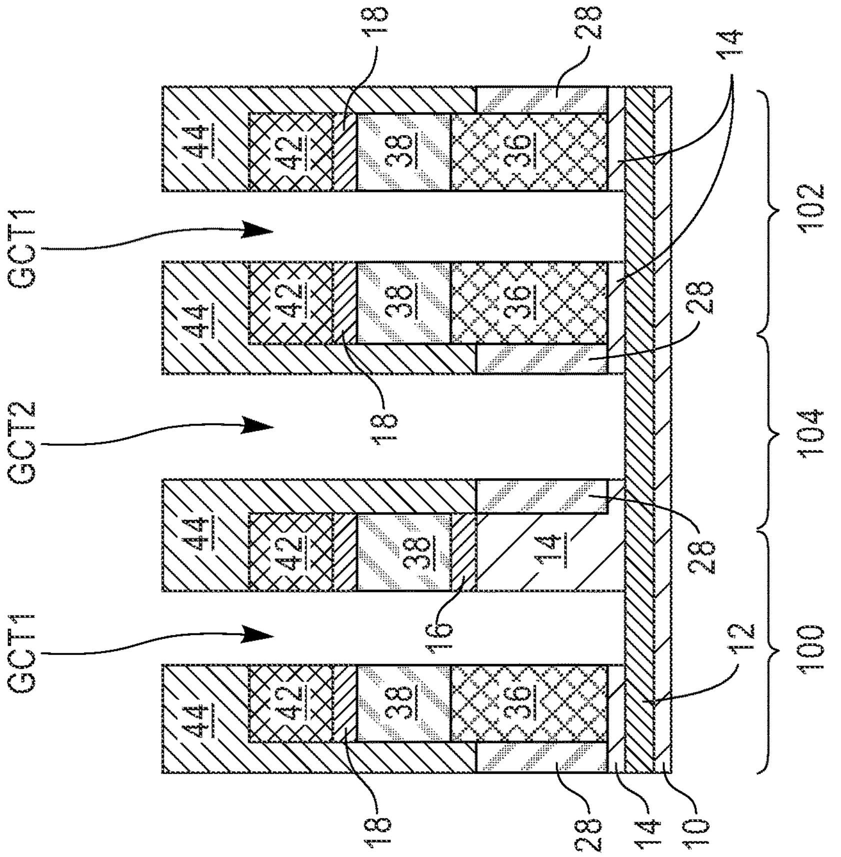
FIG. 3C is a cross sectional view of the exemplary structure shown in FIGS. 3A-3B and though Y2-Y2 shown in FIG. 1.
Figure 3B:
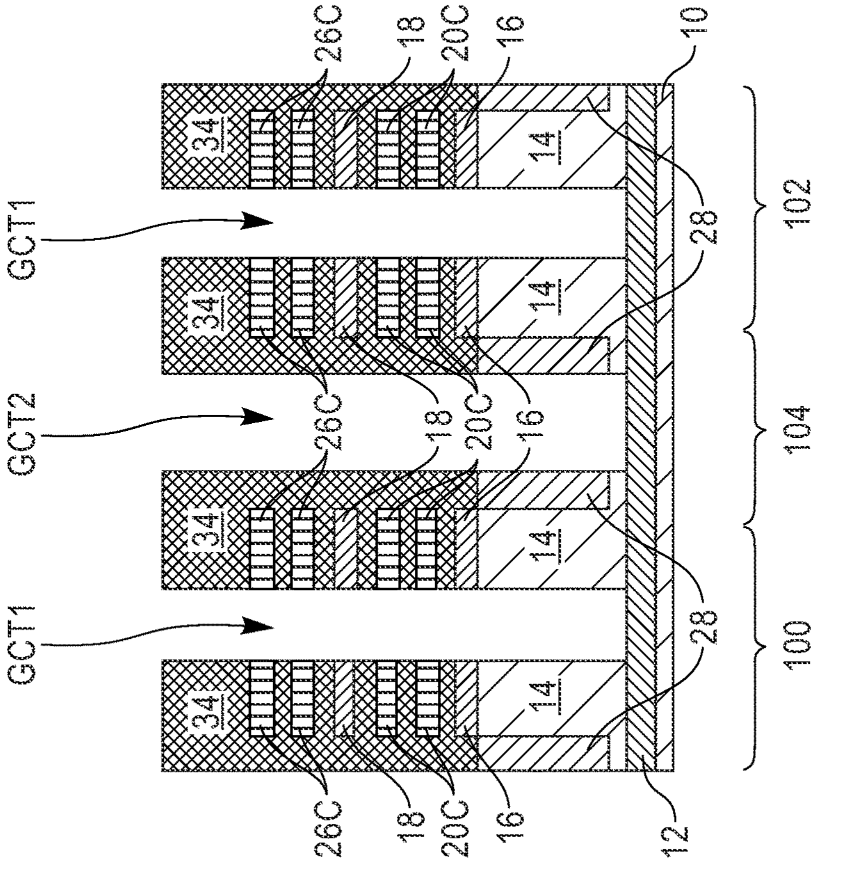

Referring now to FIGS. 3A-3B, there are illustrated the exemplary structure shown in FIGS. 2A-2B, respectively, after stacked FET gate cut patterning which provides inter-device gate cut trenches GCT1 and an external device gate cut trench GCT2. FIG. 3C is a cross sectional view of the exemplary structure shown in FIGS. 3A-3B and along Y2-Y2 shown in FIG. 1. The stacked FET gate cut patterning includes forming a patterned masking stack (not shown) including a patterned photoresist material on the exemplary structure shown in FIGS. 2A-2B by deposition and lithography. The patterned masking stack has openings that physically expose different positions of the functional gate structure 34 in the first active device region 100, the non-active device region 104 and the second active device region 102. An etching process such as, for example, reactive ion etching, is then used to remove the physically exposed portions of the functional gate structure 34 thus cutting the functional gate structure 34. The inter-device gate cut trenches GCT1 are located in the first active device region 100 and the second active device region 102, while the external device gate cut trench GCT2 is located in the non-active device region 104.

In the first active device region 100 and the second active device region 102 and as is shown in the cross sectional view of FIG. 3B, this etch not only removes a portion of the functional gate structure 34, but it also removes a portion of each of the second semiconductor channel material nanosheets 26NS, the middle dielectric isolation layer 18, the first semiconductor channel material nanosheets 20NS as well as the second semiconductor material layer 14. The etch stops on a sub-surface of the second semiconductor material layer 14. Each remaining first semiconductor channel material nano sheet 20NS can referred to herein as a first semiconductor channel material fork sheet 20C, and each remaining second semiconductor channel material nanosheet 26NS can be referred to herein as a second semiconductor channel material fork sheet 26C. The first semiconductor channel material fork sheets 20C have a length that is less than the original length of the first semiconductor channel material nanosheets 20NS, and the second semiconductor channel material fork sheets 26C have a length that is less than the original length of the second semiconductor channel material nanosheets 26NS. The fork sheets serve as a channel material of the resultant stacked fork sheet devices. In the non-active device region 104 and as is shown in the cross sectional view of FIG. 3B, this etch not only removes a portion of the functional gate structure 34, but also the shallow trench dielectric isolation structure 28 as well as the second semiconductor material layer 14; again this etch stops on a sub-surface of the second semiconductor material layer 14. FIG. 3C denotes the etch that is performed in the source/drain area. After the etch, the patterning masking layer is removed from the structure. In some embodiments, the patterning photoresist material is removed immediately after the pattern has transferred into the underlying masking layers of the patterned masking layer.

Figure 4A:
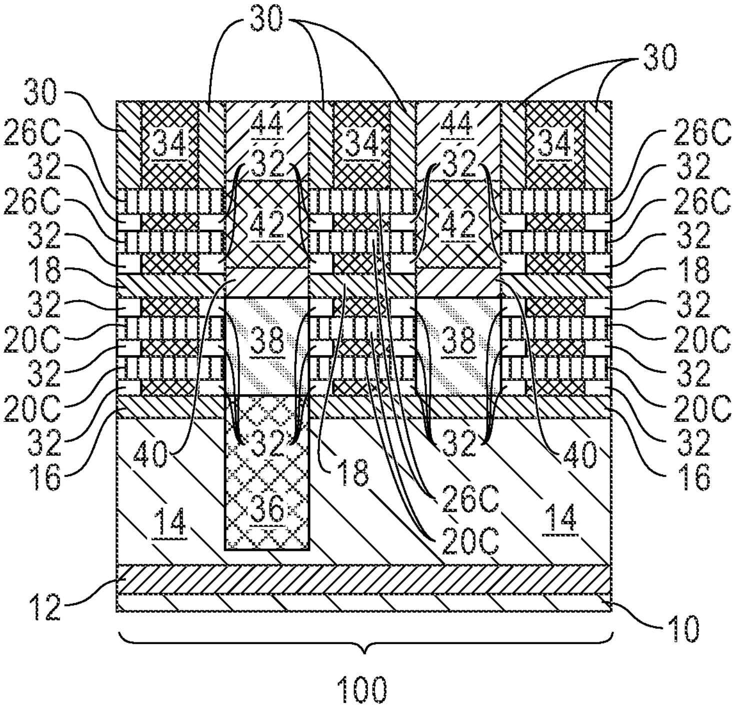
FIGS. 4A, 4B and 4C are cross sectional views of the exemplary structure shown in FIGS. 3A, 3B and 3C, respectively, after filling each of the inter-device gate cut trenches and the external device gate cut trench with a dielectric material to provide inter-device dielectric pillars and an external device dielectric pillar, respectively.
Figure 4C:
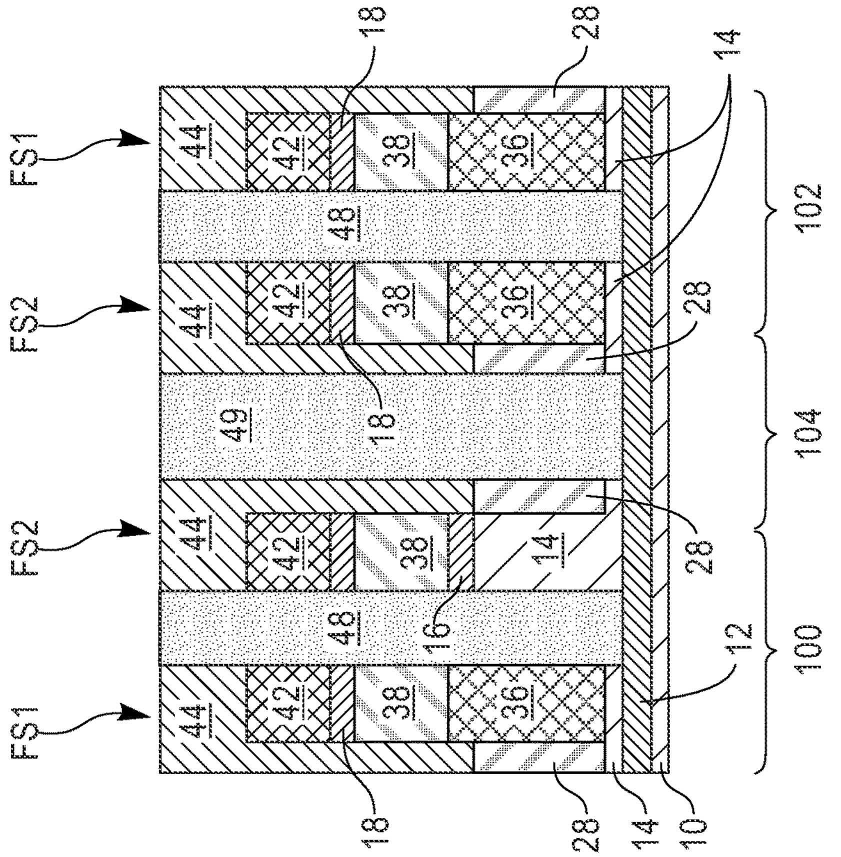
Figure 4B:
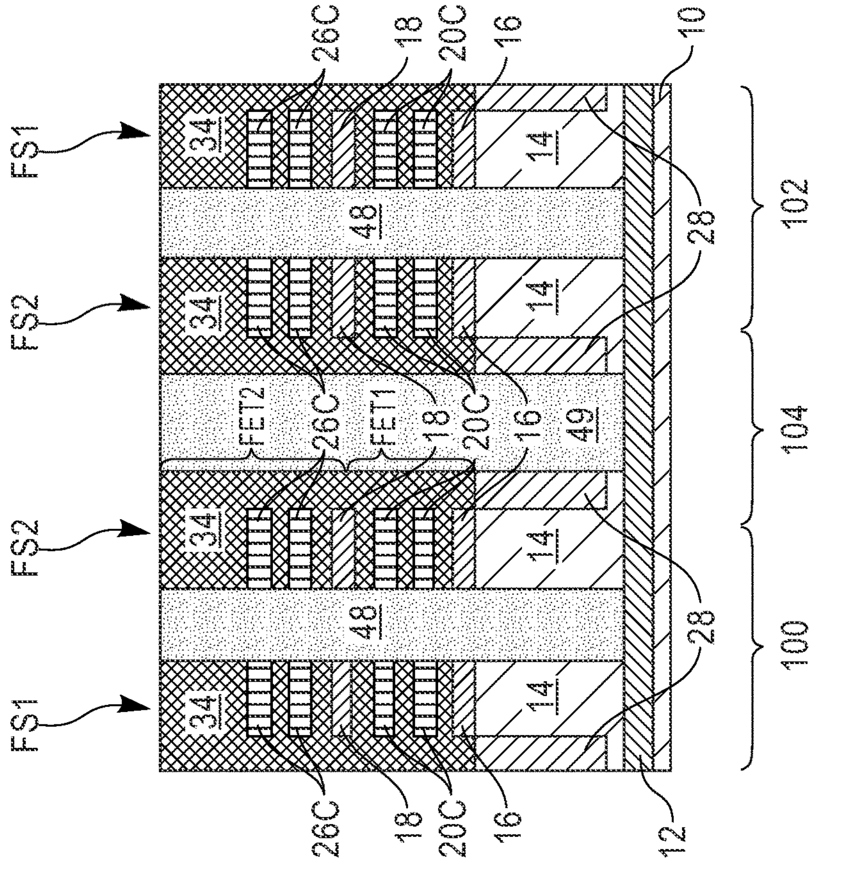

Referring now to FIGS. 4A, 4B and 4C, there are illustrated the exemplary structure shown in FIGS. 3A, 3B and 3C, respectively, after filling each of the inter-device gate cut trenches GCT1 and the external device gate cut trench GCT2 with a dielectric material to provide inter-device dielectric pillars 48 and an external device dielectric pillar 49, respectively. The dielectric material that provides the inter-device dielectric pillars 48 and an external device dielectric pillar 49 is compositionally different from at least the first front side ILD material layer 44 and the dielectric spacer 30. In one example, the dielectric material that provides inter-device dielectric pillars 48 and an external device dielectric pillar 49 is a silicon carbon based dielectric material such as, for example, silicon carbide or a dielectric including atoms of Si, C and O. Other dielectric materials besides a silicon carbon based dielectric material can be used as the dielectric material that provides dielectric material that provides the inter-device dielectric pillars 48 and an external device dielectric pillar 49.

The inter-device dielectric pillars 48 and an external device dielectric pillar 49 can be formed by first depositing a dielectric material, and thereafter recessing the deposited dielectric material. The depositing of the dielectric material that provides the inter-device dielectric pillars 48 and an external device dielectric pillar 49 can include atomic layer (ALD), chemical vapor deposition (CVD), physical vapor deposition (PECVD), or physical vapor deposition (PVD), and the recessing of the deposited dielectric material that provides the inter-device dielectric pillars 48 and an external device dielectric pillar 49 can include an etch that is selective in removing the dielectric material that provides the inter-device dielectric pillars 48 and an external device dielectric pillar 49. In some embodiments, each of the inter-device dielectric pillars 48 and the external device dielectric pillar 49 has a topmost surface that is coplanar with a topmost surface of the functional gate structure 34 and the topmost surface of the first front side ILD material layer 44.

As is illustrated in FIG. 4B, each of the first active device region 100 and the second active device region 102 includes a pair of fork sheet devices, FS1 and FS2, that are spaced apart by an inter-device dielectric pillar 48. Each fork sheet device, i.e., FS1 and FS2, includes a second FET, i.e., FET_2, stacked above a first FET, i.e., FET_1. In the present application, FET_1 includes a plurality of spaced apart first semiconductor channel material fork sheets 20C extending outward from the inter-device dielectric pillar 48, and FET_2 includes a plurality of spaced apart second semiconductor channel material fork sheets 26C extending outward from the inter-device dielectric pillar 48, and the bottom dielectric isolation layer 16 is located beneath FET_1, and the middle dielectric isolation layer 18 is located between a bottommost second semiconductor channel material fork sheet and a topmost first semiconductor channel material fork sheet, and functional gate structure 34 wraps around each spaced apart second semiconductor channel material fork sheet 26C, each spaced apart first semiconductor channel material fork sheet 20C and the middle dielectric isolation layer 18. The term "wrap" around here means that the functional gate structure 34 contacts the top and bottom of each of the semiconductor channel material fork sheets and the middle dielectric isolation layer 18 as well as an end wall of each of the semiconductor material fork sheets and the middle dielectric isolation layer 18.

Figure 5A:
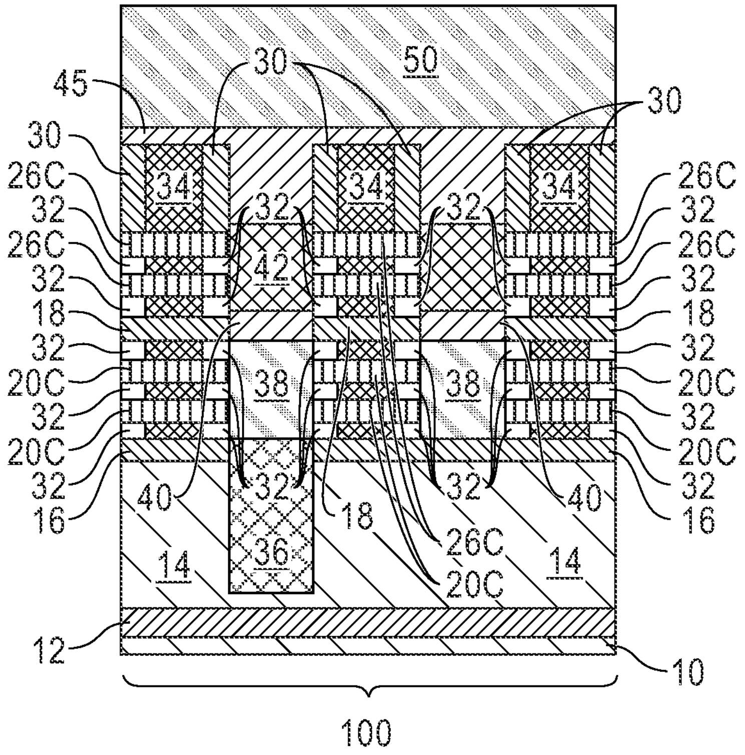
FIGS. 5A, 5B and 5C are cross sectional views of the exemplary structure shown in FIGS. 4A, 4B and 4C, respectively, after forming a second front side ILD material layer on top of each functional gate structure, each inter-device dielectric pillar and the external device dielectric pillar, forming a patterned mask layer having an opening that physically exposes the external device dielectric pillar in the non-active device region and between two adjacent functional gate structures, and removing a portion of the physically exposed external device dielectric pillar in the non-active device region and between the two adjacent functional gate structures to provide a local interconnect opening.
Figure 5C:
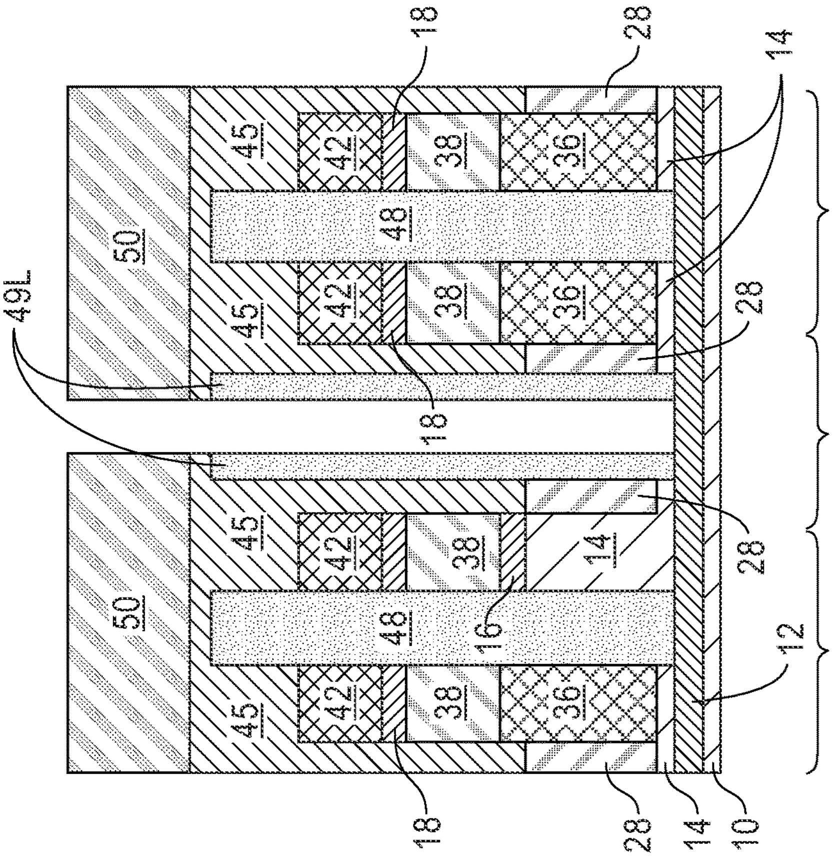
Figure 5B:
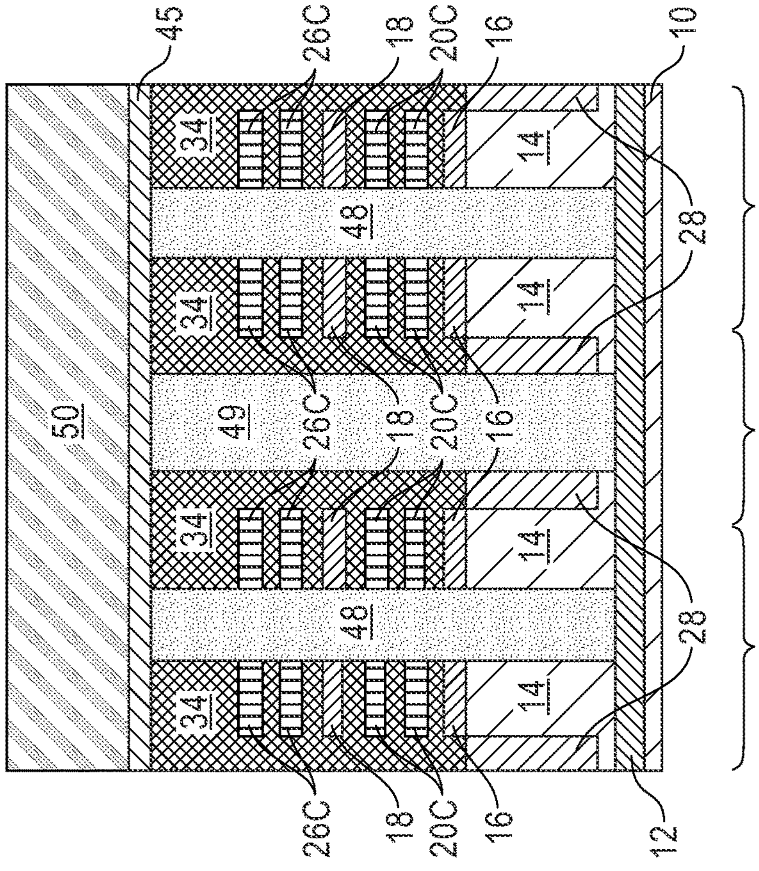

Referring now to FIGS. 5A, 5B and 5C, there are illustrated the exemplary structure shown in FIGS. 4A, 4B and 4C, respectively, after forming a second front side ILD material layer on top of each functional gate structure 34, each inter-device dielectric pillar 48 and the external device dielectric pillar 49 (the second front side ILD material layer is also formed on top of the first front side ILD material layer 44 and collectively they provide a front side ILD material bi-layer structure 45), forming a patterned mask layer 50 having an opening that physically exposes the external device dielectric pillar 49 in the non-active device region 104 and between two adjacent functional gate structures (i.e., the source/drain region as is shown in FIG. 5C), and removing a portion of the physically exposed external device dielectric pillar 49 in the non-active device region 104 and between two adjacent functional gate structures 34 to provide a local interconnect opening (as is shown in FIG. 5C).

The second front side ILD material layer includes one of the dielectric materials mentioned above for the first front side ILD material layer 44. The dielectric material that provides the second front side ILD material layer can be compositionally the same as, or compositionally different from, the dielectric material that provides the first front side ILD material layer 44. The second front side ILD material layer can be formed utilizing a deposition process such as, for example, CVD, PECVD, ALD or PVD; the first front side material layer 44 was also provided utilizing one of these aforementioned deposition processes.

The patterned mask layer 50 having the opening that physically exposes the external device dielectric pillar 49 in the non-active device region 104 and within the source/drain area includes any masking material such as, for example, an organic planarization layer (OPL). The patterned mask layer 50 can be formed by deposition of the masking material, followed by lithographic patterning.

The removal of a portion of the physically exposed external device dielectric pillar 49 in the non-active device region 104 includes a recess etching process that is selective in removing the dielectric material that provides the external device dielectric pillar 49. The etch stops on a surface of the etch stop layer 12. A portion of the external device dielectric pillar 49 remains along the sidewalls of the local interconnect opening that is formed by this etch. The remaining external device dielectric pillar 49 can be referred to as a local interconnect dielectric material liner 49L.

Figure 6A:
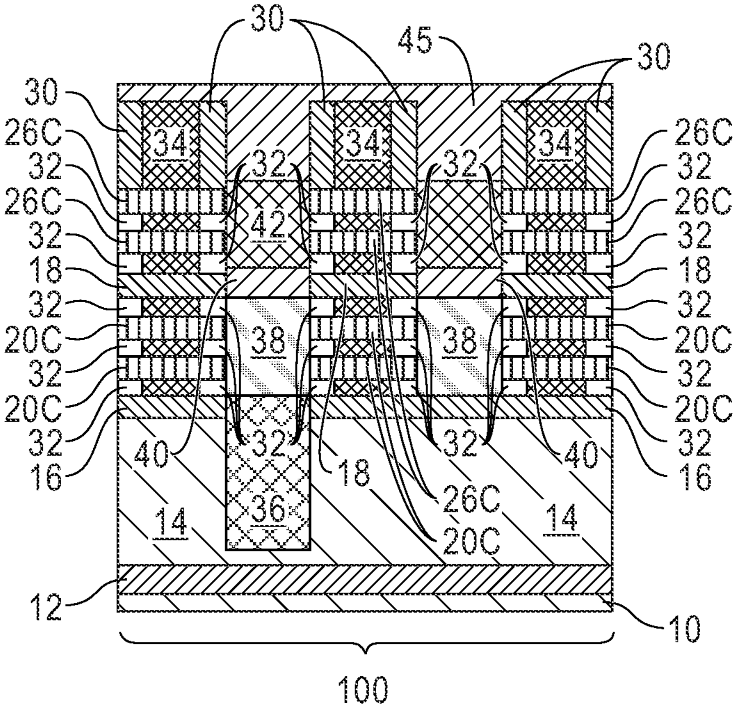
FIGS. 6A, 6B and 6C are cross sectional views of the exemplary structure shown in FIGS. 5A, 5B and 5C, respectively, after removing the patterned masking layer, and forming a local interconnect structure in the local interconnect opening, the local interconnect structure is laterally surrounded by a remaining portion of the external device dielectric pillar.
Figure 6B:
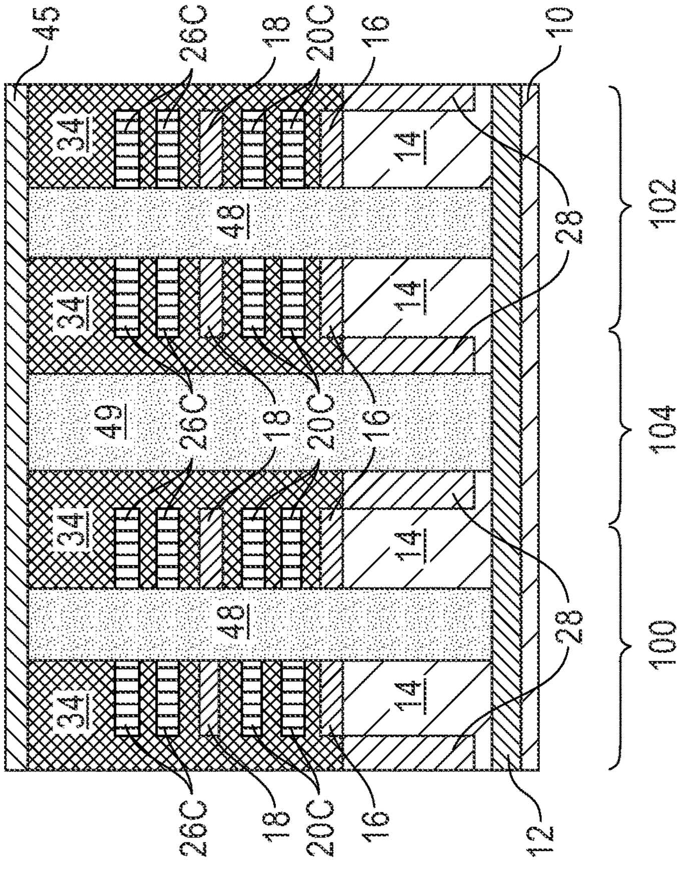
Figure 6C:
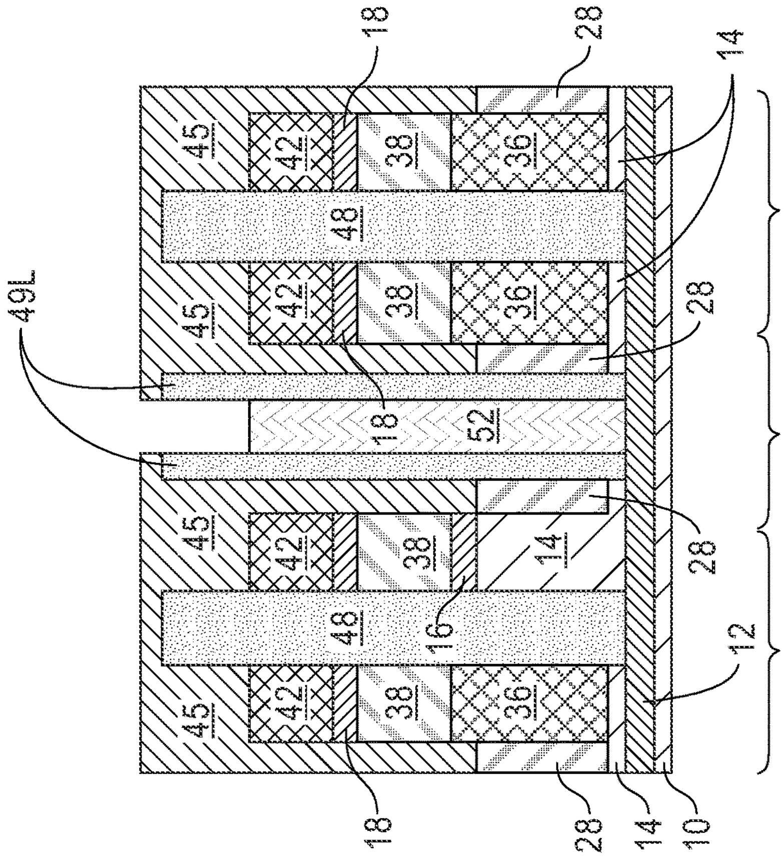

Referring now to FIGS. 6A, 6B and 6C, there are illustrated the exemplary structure shown in FIGS. 5A, 5B and 5C, respectively, after removing the patterned mask layer 50, and forming a local interconnect structure 52 in the local interconnect opening, the local interconnect structure 52 is laterally surrounded by a remaining portion of the external device dielectric pillar 49 (i.e., the local interconnect dielectric material liner 49L). The removal of the patterned mask layer 50 includes a material removal process that is selective in removing the masking material from the structure.

The local interconnect structure 52 is composed of an electrically conductive metal (such as, for example, copper (Cu), aluminum (Al), tungsten (W) or cobalt (Co)), Ru or an electrically conductive metal alloy (such as, for example, a Cu—Al alloy). Note that a thin metal adhesion layer may be deposited first prior to the deposition of conductive metal. The local interconnect structure 52 can be formed by first depositing an electrically conductive material in the local interconnect opening and thereafter recessing the deposited electrically conductive material utilizing a recessing etching process. The depositing of the electrically conductive material can include CVD, PECVD, ALD, sputtering or plating. The local interconnect structure 52 has a vertical height that is less than a vertical height of the local interconnect dielectric material liner 49L (see, for example, FIG. 6C). At this point of the present application, the local interconnect structure 52 has a surface that lands on the etch stop layer 12.

Figure 7A:
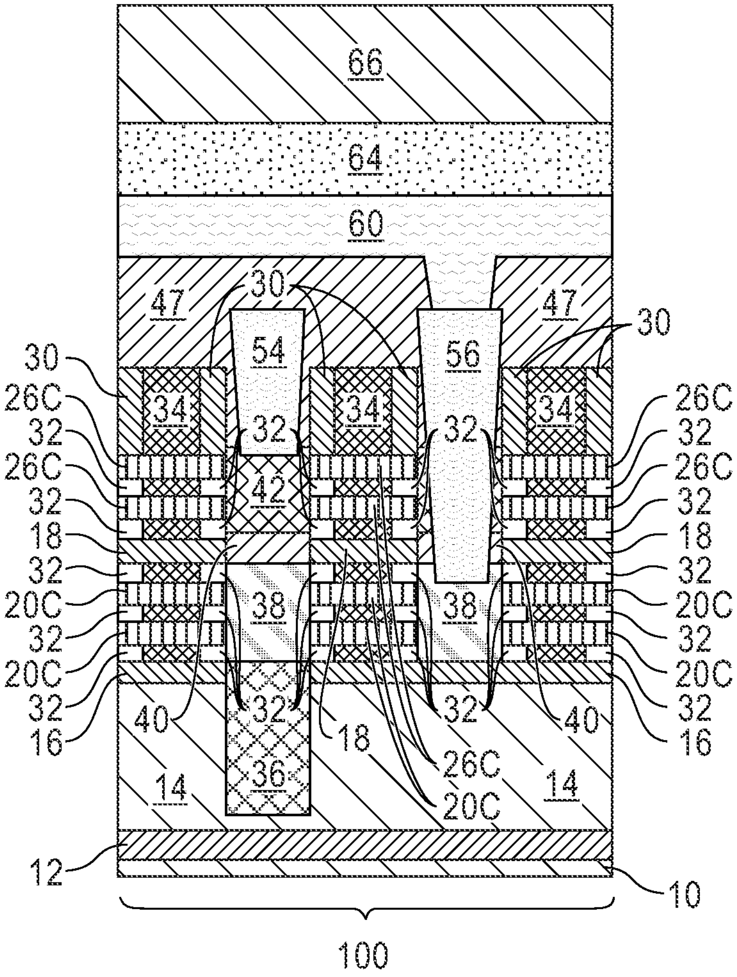
FIGS. 7A, 7B and 7C are cross sectional views of the exemplary structure shown in FIGS. 6A, 6B and 6C, respectively, after forming a third front side ILD material layer, forming front side contact structures and first front side back-end-of-the-line (BEOL) via and metal line structures in the various front side ILD material layers, forming a front side additional BEOL structure and forming a carrier wafer on the front side additional BEOL structure.
Figure 7B:
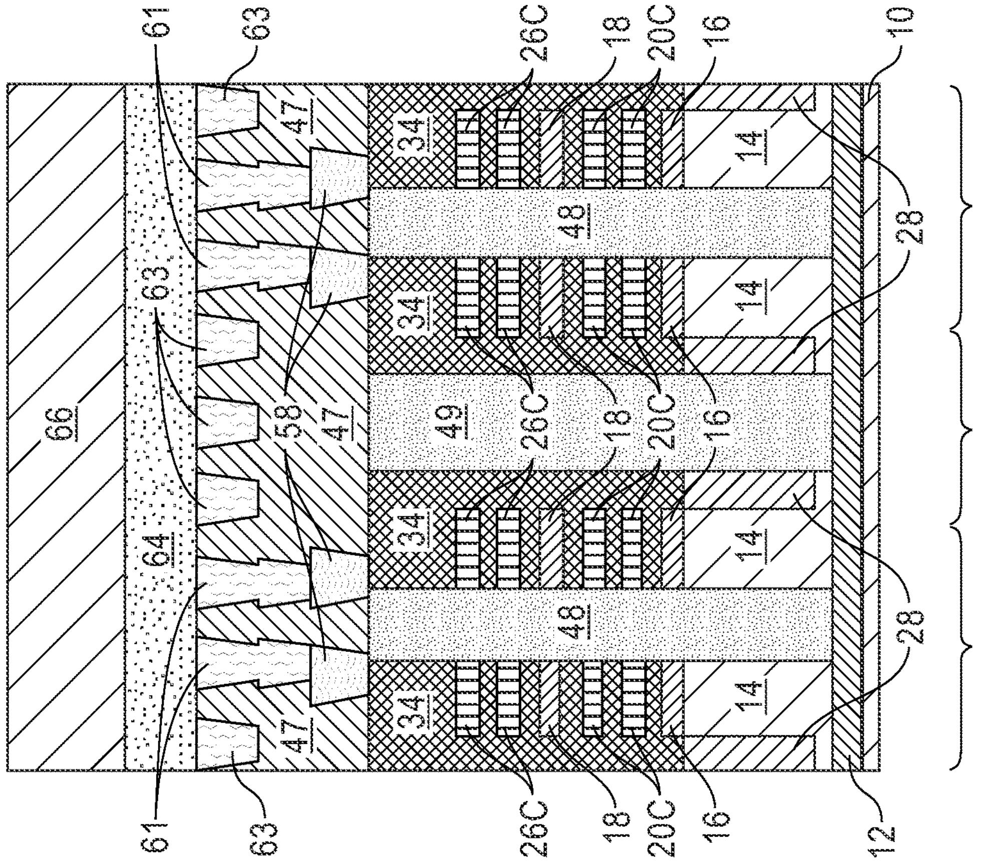
Figure 7C:
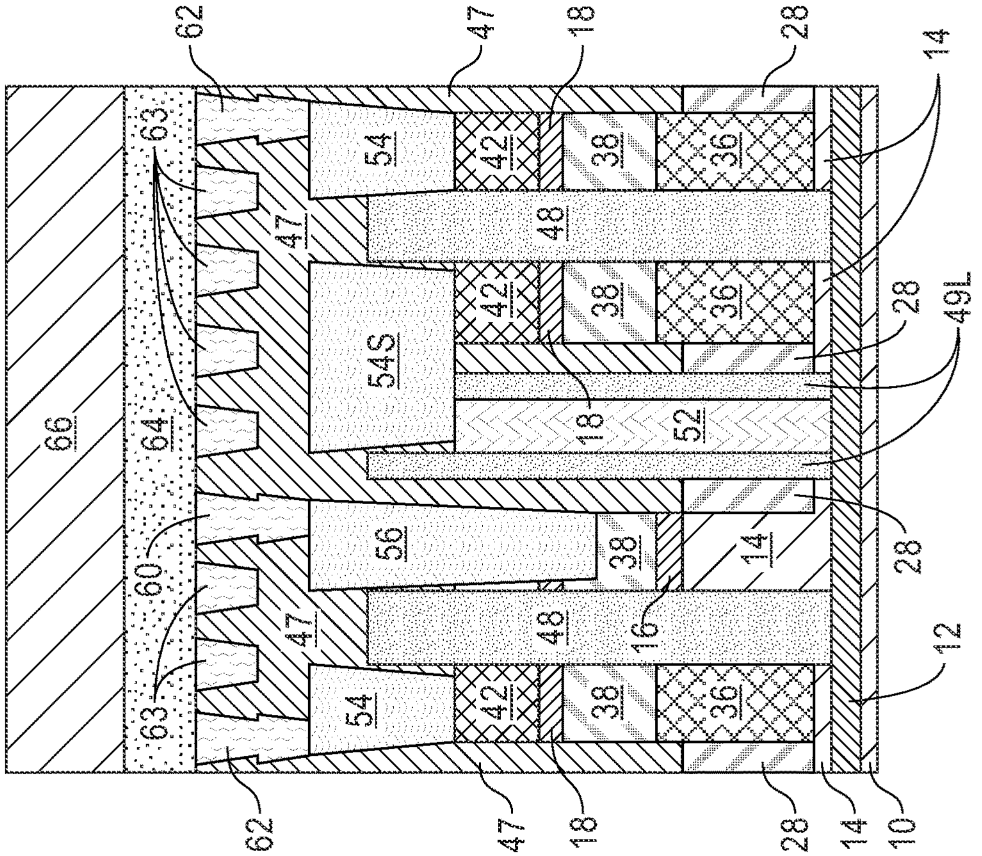

Referring now to FIGS. 7A, 7B and 7C, there are illustrated the exemplary structure shown in FIGS. 6A, 6B and 6C, respectively, after forming a third front side ILD material layer, forming front side contact structures 54, 54S, 56, 58 and first level BEOL via and metal line structures 60, 61, 62, 63 in the various front side ILD material layers, forming a front side additional BEOL structure 64 and forming a carrier wafer 66 on the front side additional BEOL structure 64.

The third front side ILD material layer is formed on the front side ILD material bi-layer structure 45 and collectively they provide a front side ILD material multilayered stack 47 as shown in FIGS. 7A, 7B and 7C. In the present application, a lower portion of third front side ILD material layer is formed first, then the front side contact structures 54, 54S, 56, 58 are formed, thereafter an upper portion of the third front side ILD material layer is formed, and next the lowest BEOL layer (M1/V0) structures 60, 61, 62, 63 are formed. The third front side ILD material layer includes one of the dielectric materials mentioned above for the first front side ILD material layer 44. The dielectric material that provides the third front side ILD material layer can be compositionally the same as, or compositionally different from, the first front side ILD material layer 44 and/or the second front side ILD material layer. The third front side ILD material layer can be formed utilizing one of the deposition processes mentioned above for forming the second front side ILD material layer.

The front side contact structures 54, 54S, 56, 58 can include a contact conductor material such as, for example, W, Cu, Al, Co, Ru, Mo, Os, Ir, Rh, or an alloy thereof. In embodiments, the front side contact structures 54, 54S, 56, 58 can also include a silicide liner such as TiSi, NiSi, NiPtSi, etc., and an adhesion metal liner, such as TiN. The contact conductor material can be formed by any suitable deposition method such as, for example, atomic layer deposition (ALD), CVD, physical vapor deposition (PVD) or plating. The front side contact structures 54, 54S, 56, 58 can be formed by forming trenches in a lower portion of the third front side ILD material layer. In some cases, the trenches extend down and physically expose the second source/drain region 42. In other cases, the trenches extend down and physically expose the first source/drain region 38. In yet other cases, the trenches extend down and physically expose the functional gate structure 34, while yet in other cases the trenches extend down and physically expose one side of the local interconnect structure 52 and an adjacent second source/drain region 42. Each trench is then filled with a contact conductor material, and then planarized to remove any contact conductor material that is located outside the trenches.

In the present application, the front side contact structure that contacts both the first source/drain region 38 and second source/drain region 42 can be referred to as a shared front side source/drain contact structure 56 (this is a first front side source/drain contact structure of the present application), the front side contact structure that contacts the second source/drain region 42 can be referred to as a second front side source/drain contact structure 54, the front side contact structure that contacts the functional gate structure 34 can be referred to as a gate contact structure 58, and the front side contact structure that contacts both the local interconnect structure 52 and the adjacent second source/drain region 42 can be referred to as a front side contact extension structure 54S (extend a front side contact to back side interconnect through the local interconnect structure). During the formation of the trench that provides the front side contact extension structure 54S, the vertical length of the local interconnect dielectric material liner 49L that is one side of the local interconnect structure 52 that is closest to the second active device region 102 is reduced as is shown in FIG. 7C. In the present application, each stacked fork sheet device contains a gate contact structure 58 as is shown in FIG. 7B.

In some embodiments (not shown), a metal semiconductor alloy region can be formed in each of the trenches that contact a source/drain region prior to depositing the contact conductor material. The metal semiconductor alloy region can be composed of a silicide or germicide. In one or more embodiments of the present application, the metal semiconductor alloy region can be formed by first depositing a metal layer (not shown) in the trenches. The metal layer can include a metal such as Ni, Co, Pt, Ti, NiPt, a rare earth metal (e.g., Er, Yt, La), an alloy thereof, or any combination thereof. The metal layer can be deposited by CVD, PVD or ALD. The thickness of the metal layer can be from 2 nm to 10 nm, although lesser and greater thicknesses can also be employed. An anneal process can be subsequently performed at an elevated temperature to induce reaction of the semiconductor material of the source/drain region to provide the metal semiconductor alloy region. The unreacted portion of the metal layer, and, if present, are then removed, for example, by an etch process (or a plurality of etching processes). In one embodiment, the etching process can be a wet etch that removes the metal in the metal layer selective to the metal semiconductor alloy in the metal semiconductor alloy regions.

The front side contact structures 54, 54S, 56, 58 can include one or more contact liners (not shown) formed along sidewalls of trenches prior to forming front side contact structures 54, 54S, 56, 58. In one or more embodiments, the contact liner (not shown) can include a diffusion barrier material. Exemplary diffusion barrier materials include, but are not limited to, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed. After that, conductive metal (such as W, Co, Ru, Cu, etc.) is filled followed by CMP.

The lowest BEOL (M1/V0) structures 60, 61, 62, 63 are composed of electrically conductive materials such as Cu, Co, W, or Ru, with a thin metal adhesion liner. The lowest BEOL (M1/V0) structures 60, 61, 62, 63 can be formed by forming metal line and via patterning in the various front side ILD material layers and then filling those lines/vias with an electrically conductive material as mentioned above using conventional dual damascene or single damascene processes. A planarization process can follow the fill of the contact openings.

Next, the front side additional BEOL structure 64 includes one or more interconnect dielectric material layers that contain one or more wiring/vias regions embedded thereon. The front side additional BEOL structure 64 can be formed utilizing BEOL processing techniques that are well known to those skilled in the art. The carrier wafer 66 can include one of the semiconductor materials mentioned above for the first semiconductor material layer 10. In the present application, the carrier wafer 66 is bonded to the front side additional BEOL structure 64.

Figure 8A:
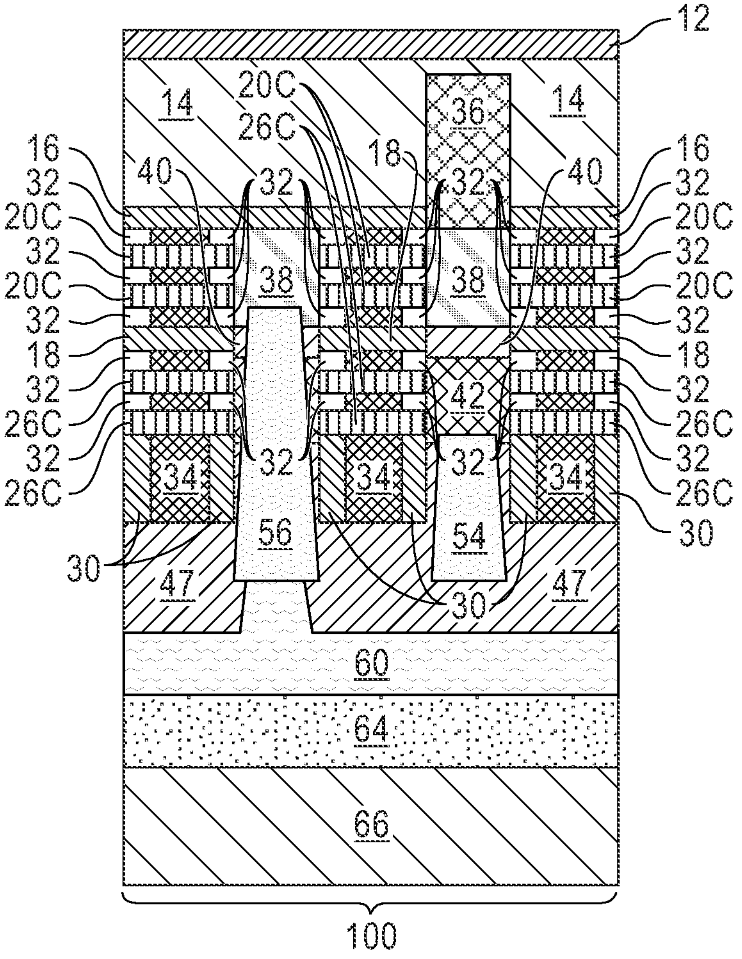
FIGS. 8A, 8B and 8C are cross sectional views of the exemplary structure shown in FIGS. 7A, 7B and 7C, respectively, after flipping the exemplary structure and removing a first semiconductor material layer of the semiconductor substrate, while stopping on an etch stop layer of the semiconductor substrate.
Figure 8C:
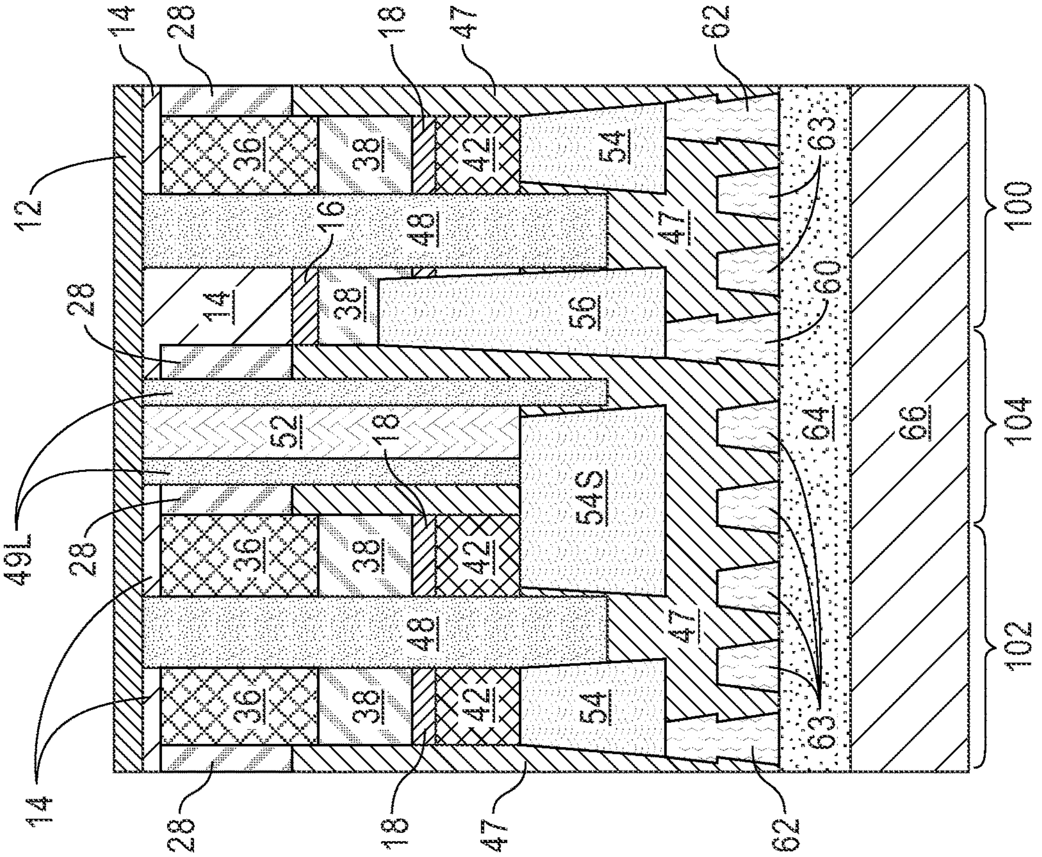
Figure 8B:
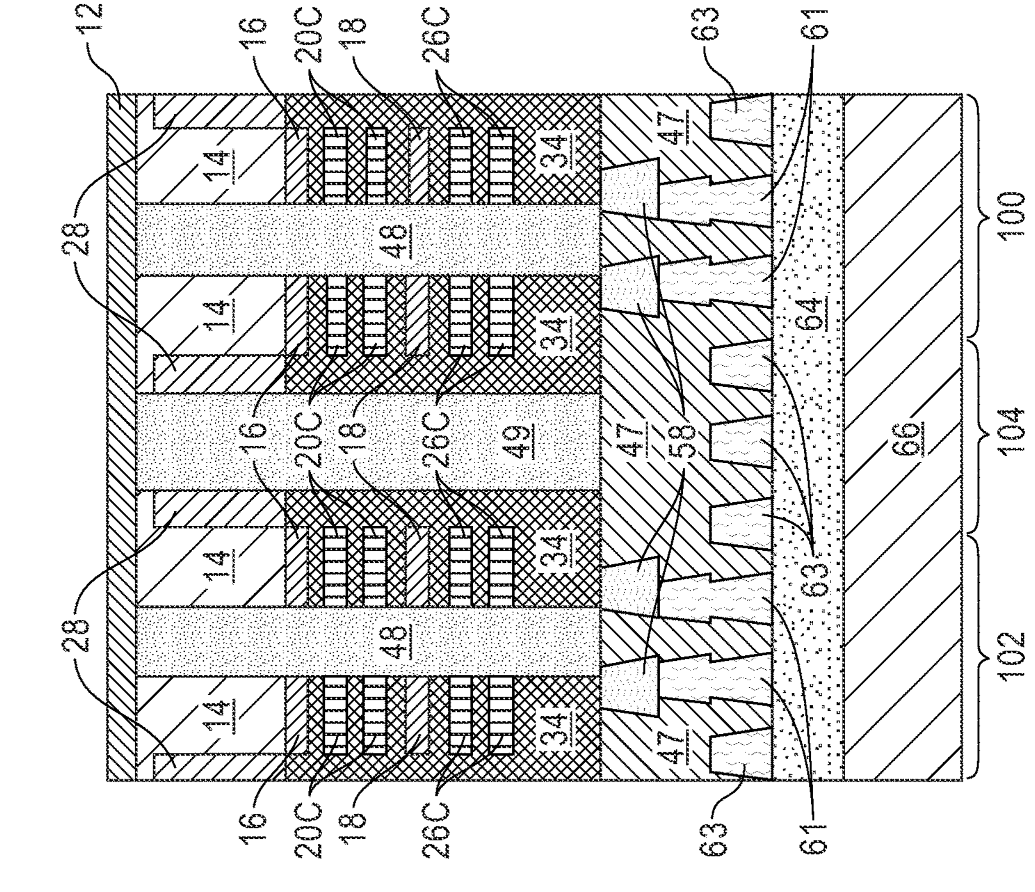

Referring now to FIGS. 8A, 8B and 8C, there are illustrated the exemplary structure shown in FIGS. 7A, 7B and 7C, respectively, after flipping the exemplary structure (to expose a back side of the wafer) and removing the first semiconductor material layer 10 of the semiconductor substrate, while stopping on the etch stop layer 12 of the semiconductor substrate. The structure is flipped 180° as can be seen by comparing the structure shown in FIGS. 8A, 8B and 8C to the structure shown in FIGS. 7A, 7B and 7C. Flipping of the structure can be performed by hand or by utilizing a mechanical means such as, for example, a robot arm. The removal of the first semiconductor material layer 10 can be performed utilizing a material removal process that is selective in removing the semiconductor material that provides the first semiconductor material layer 10. After removal of the first semiconductor material layer 10, a surface of the etch stop layer 12 is physically exposed to allow back side process of the structure.

Figure 9A:
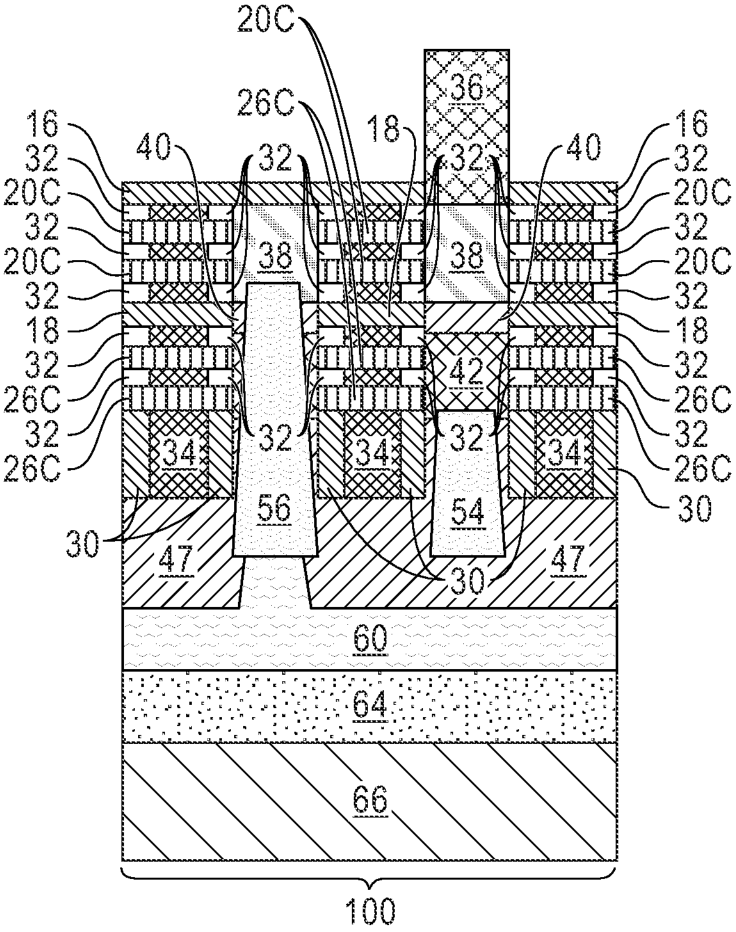
FIGS. 9A, 9B and 9C are cross sectional views of the exemplary structure shown in FIGS. 8A, 8B and 8C, respectively, after removing the etch stop layer and a second semiconductor material layer of the semiconductor substrate to at least physically expose the placeholder material layer.
Figure 9C:
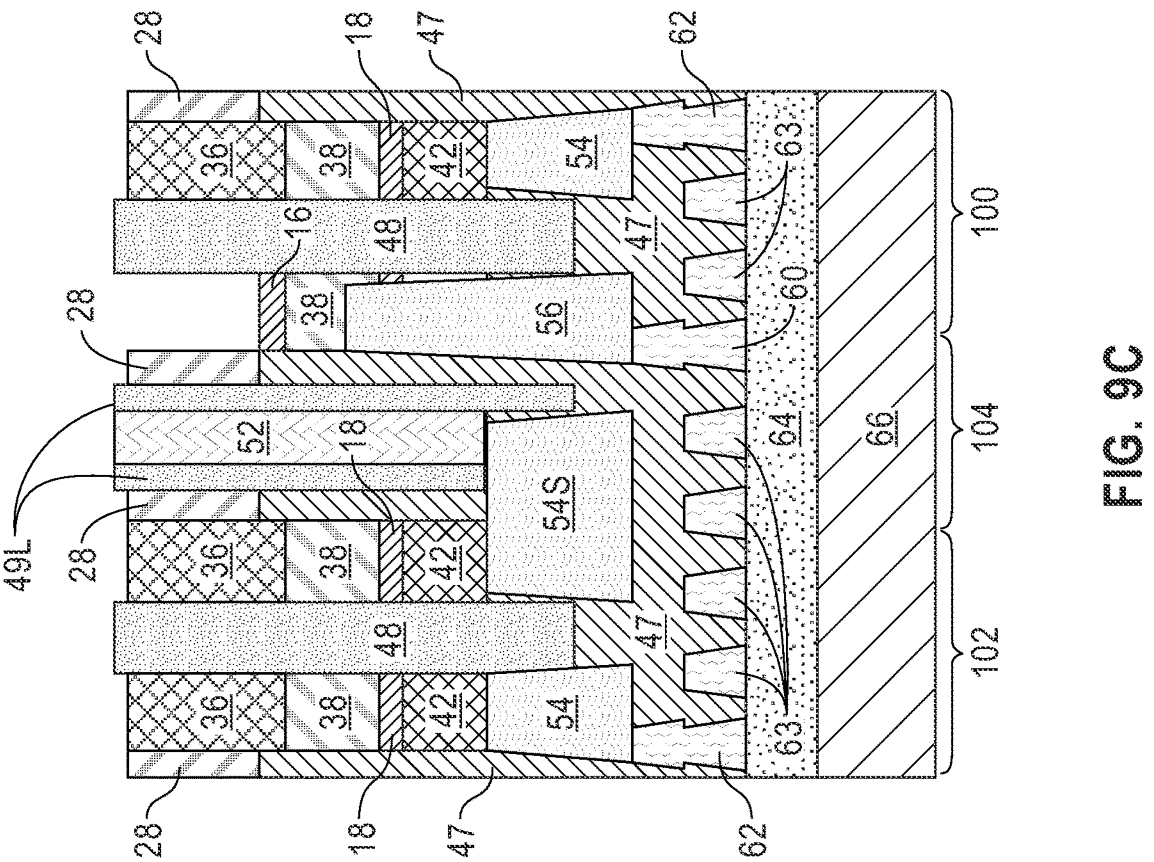
Figure 9B:
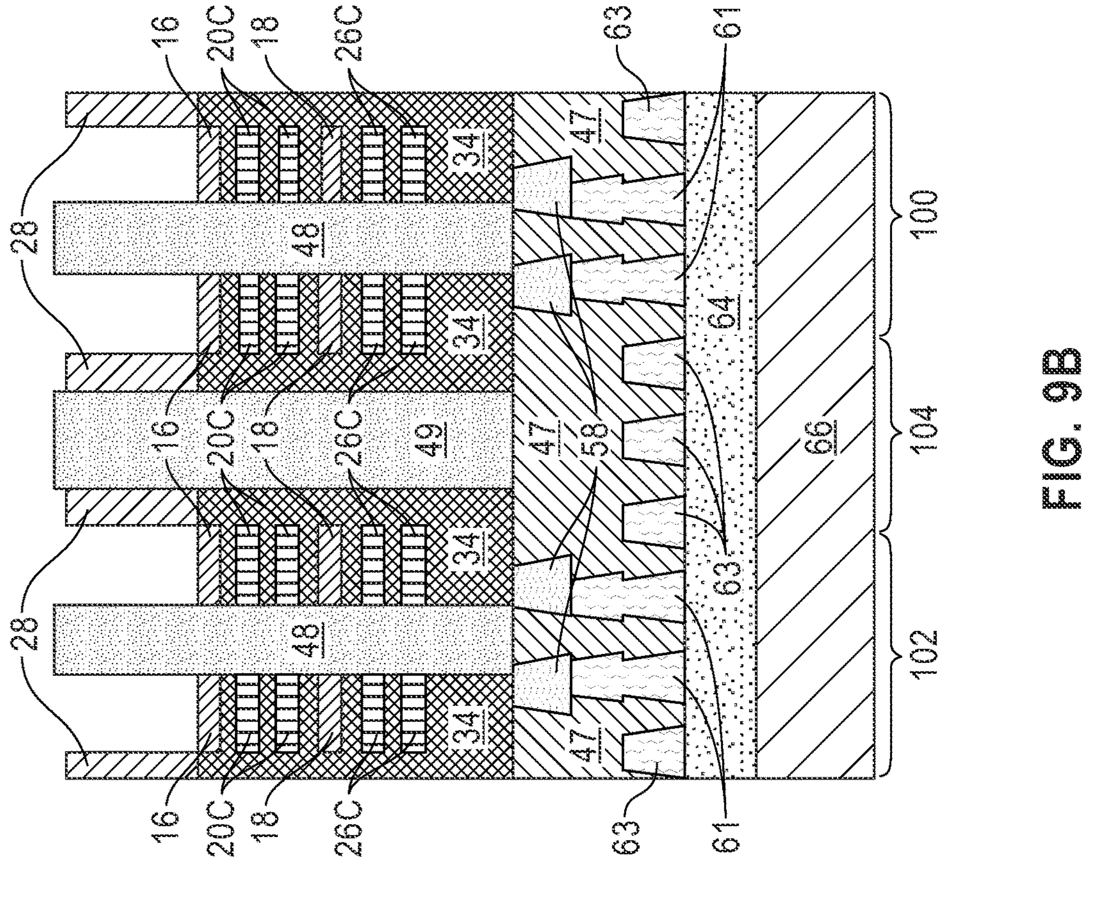

Referring now to FIGS. 9A, 9B and 9C, there are illustrated the exemplary structure shown in FIGS. 8A, 8B and 8C, respectively, after removing the etch stop layer 12 and the second semiconductor material layer 14 of the semiconductor substrate to at least physically expose the placeholder material layer 36; also physically exposed are the bottom dielectric isolation layer 16, the shallow trench isolation structure 28, the inter-device dielectric pillars 48 and the external device dielectric pillar 49. The removal of the etch stop layer 12 includes a material removal process that is selective in removing the etch stop layer 12. The removal of the second semiconductor material layer 14 includes a material removal process that is selective in removing the second semiconductor material layer 14. In some embodiments, it is possible to remove the first semiconductor material layer 10, the etch stop layer 12 and the second semiconductor layer 14 utilizing a single material removal process.

Figure 10A:
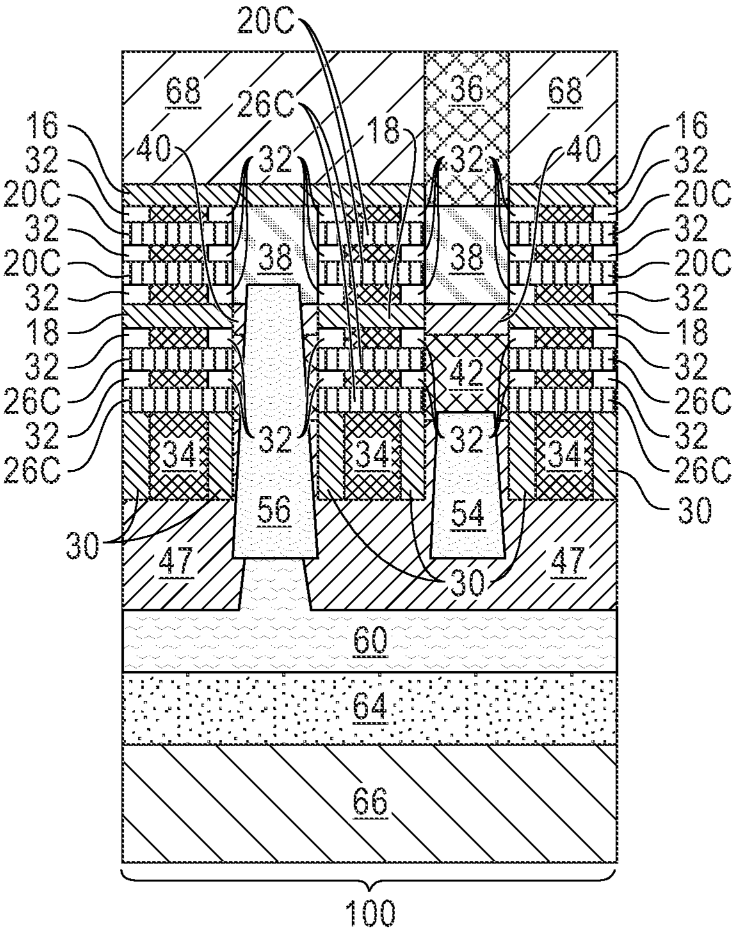
FIGS. 10A, 10B and 10C are cross sectional views of the exemplary structure shown in FIGS. 9A, 9B and 9C, respectively, after forming a first back side ILD material layer having a surface that is coplanar with a surface of the placeholder material layer.
Figure 10C:
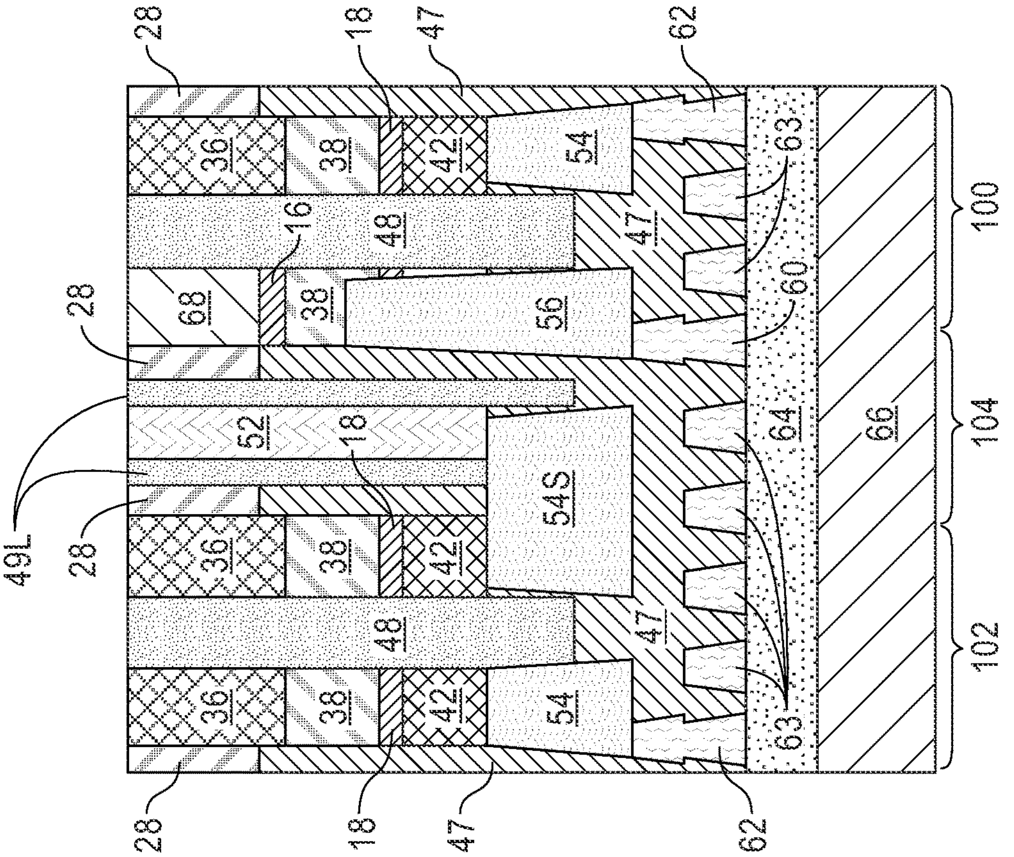
Figure 10B:
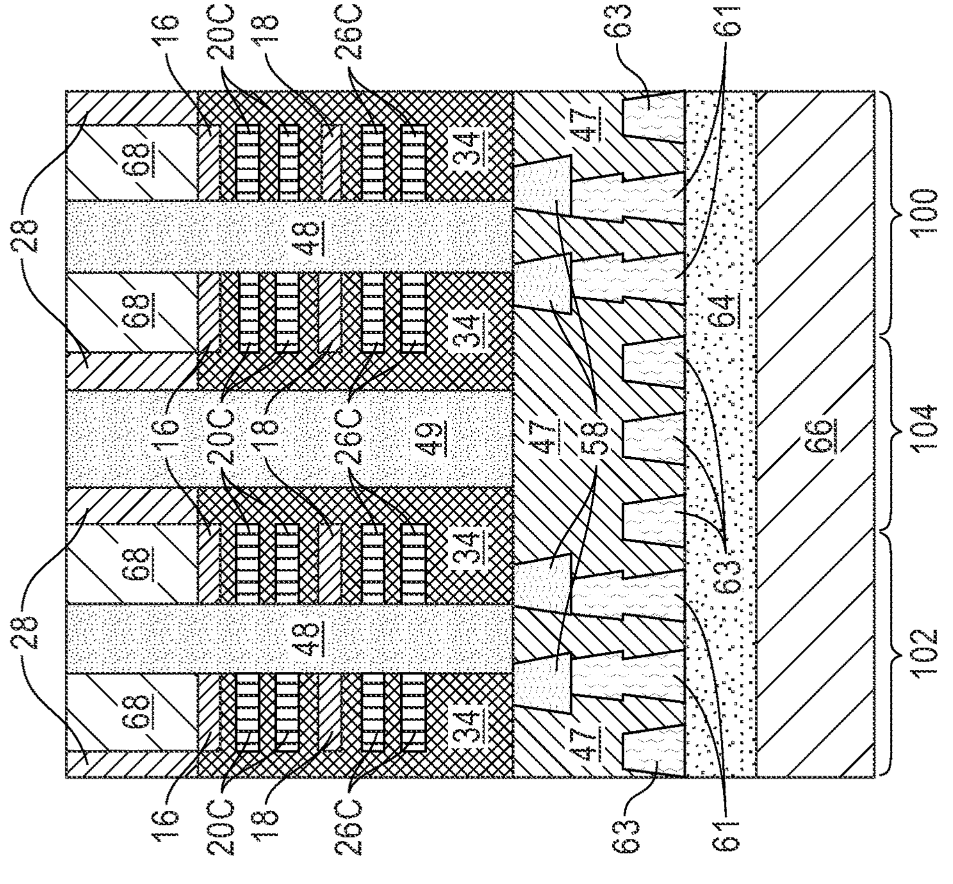

Referring now to FIGS. 10A, 10B and 10C, there are illustrated the exemplary structure shown in FIGS. 9A, 9B and 9C, respectively, after forming a first back side ILD material layer 68 having a surface that is coplanar with a surface of the placeholder material layer 36; this coplanar surface of the first back side ILD material layer 68 is also coplanar with a surface of each of the bottom dielectric isolation layer 16, the shallow trench isolation structure 28, the inter-device dielectric pillars 48 and the external device dielectric pillar 49. The first back side ILD material layer 68 includes one of the dielectric materials mentioned above for the first front side ILD material layer 44. The first back side ILD material layer 68 can be formed by a deposition process, followed by a planarization process.

Figure 11A:
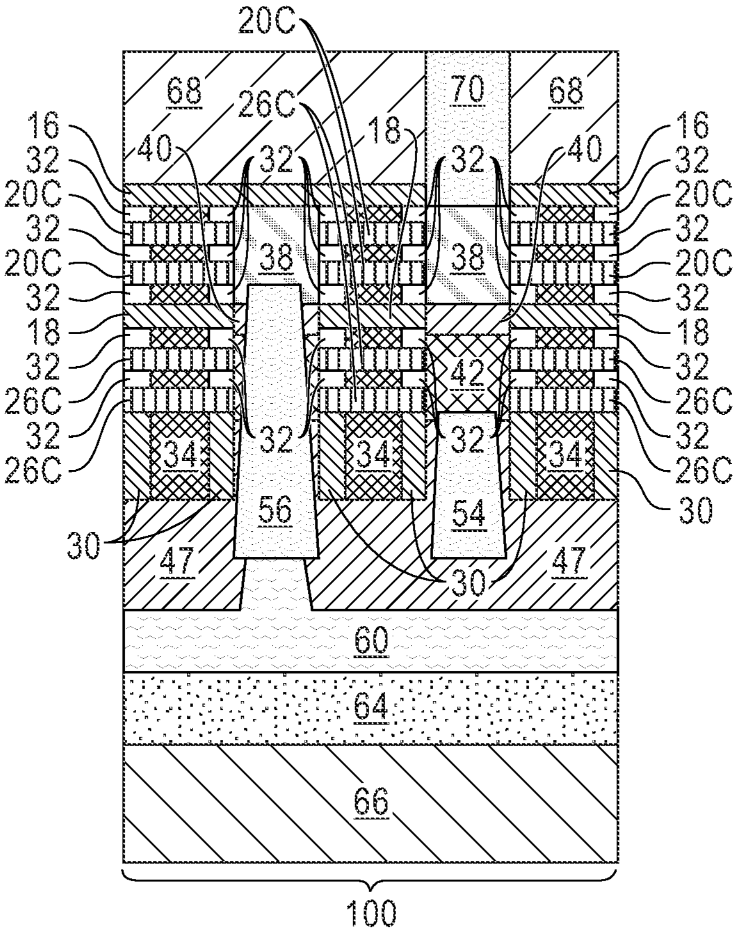
FIGS. 11A, 11B and 11C are cross sectional views of the exemplary structure shown in FIGS. 10A, 10B and 10C, respectively, after removing the placeholder material layer, and forming back side source/drain contact structures.
Figure 11C:
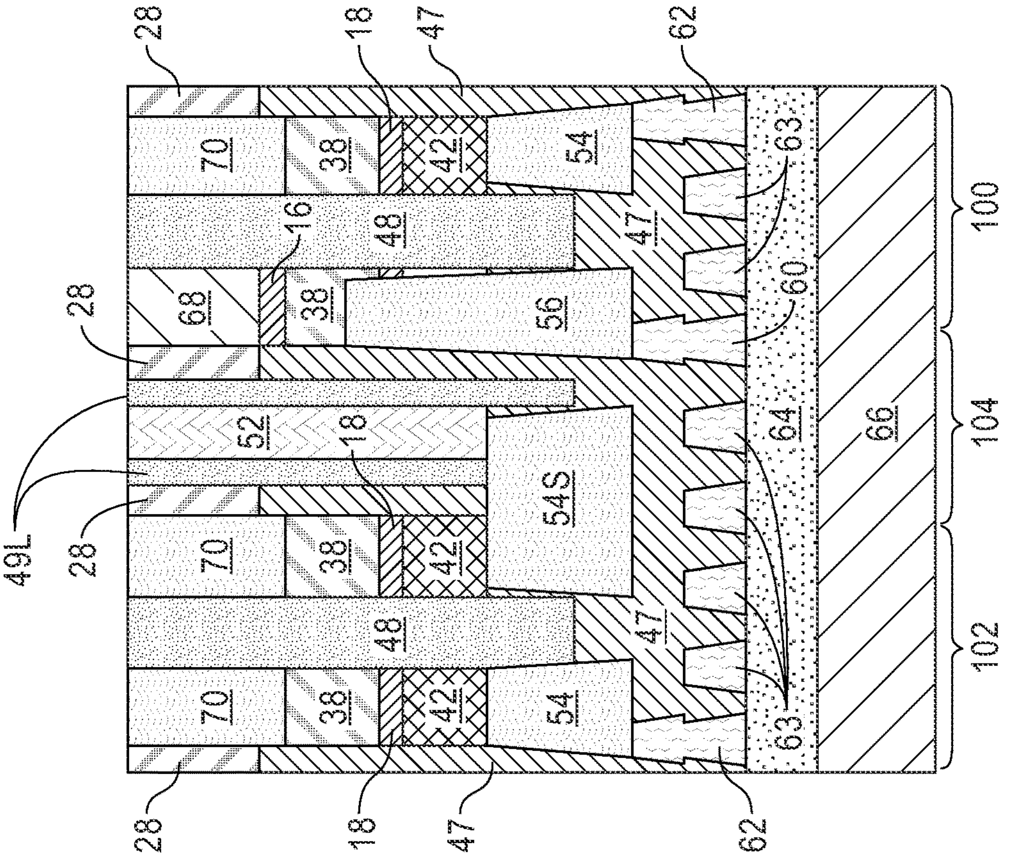
Figure 11B:
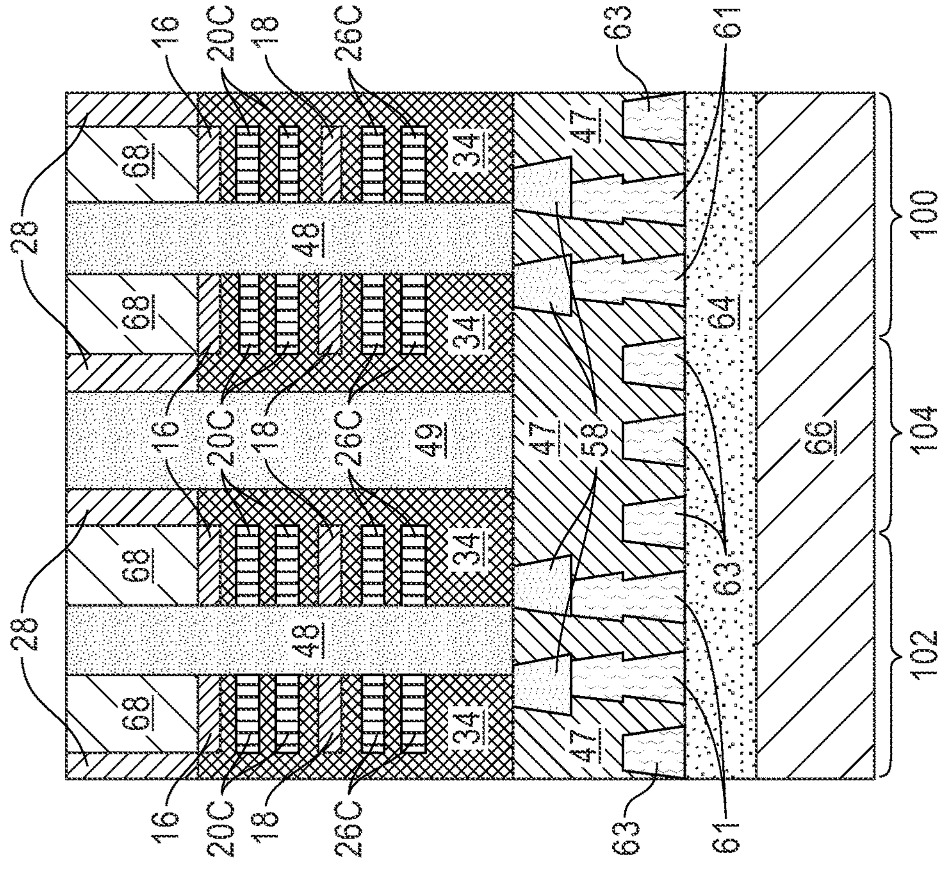

Referring now to FIGS. 11A, 11B and 11C, there are illustrated the exemplary structure shown in FIGS. 10A, 10B and 10C, respectively, after removing the placeholder material layer 36, and forming back side source/drain contact structures 70 in the area previously occupied by the placeholder material layer 36. The placeholder material layer 36 can be removed utilizing a material removal process that is selective in removing the placeholder material. The back side source/drain contact structures 70 contact a surface of one of the first source/drain regions 38 that does not include contact by the shared front side source/drain contact structure 56. The first source/drain regions 38 that includes contact with the back side source/drain contact structure 70 is on a same side of the inter-device dielectric pillars 48 that includes the second front side source/drain contact structure 54 contacting the second source/drain region 42. The back side source/drain contact structures 70 include materials as mentioned above for the front side contact structures 54, 54S, 56, 58. The back side source/drain contact structures 70 can be formed by deposition of the appropriate material(s) and then performing a planarization process.

Figure 12A:
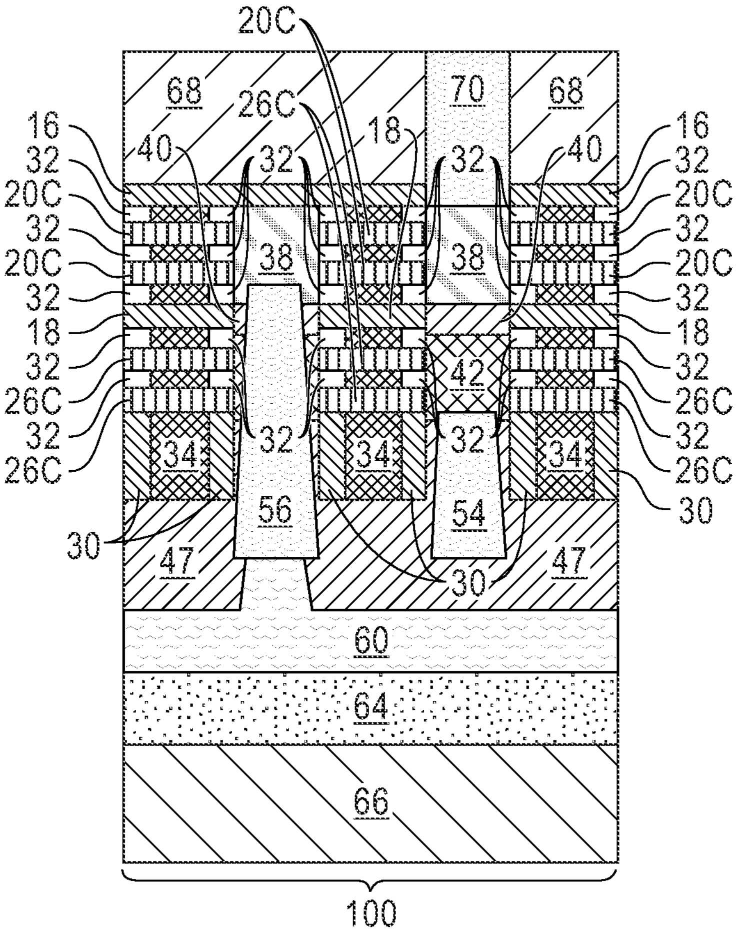
FIGS. 12A, 12B and 12C are cross sectional views of the exemplary structure shown in FIGS. 11A, 11B and 11C, respectively, after forming back side metal jumper structures.
Figure 12C:
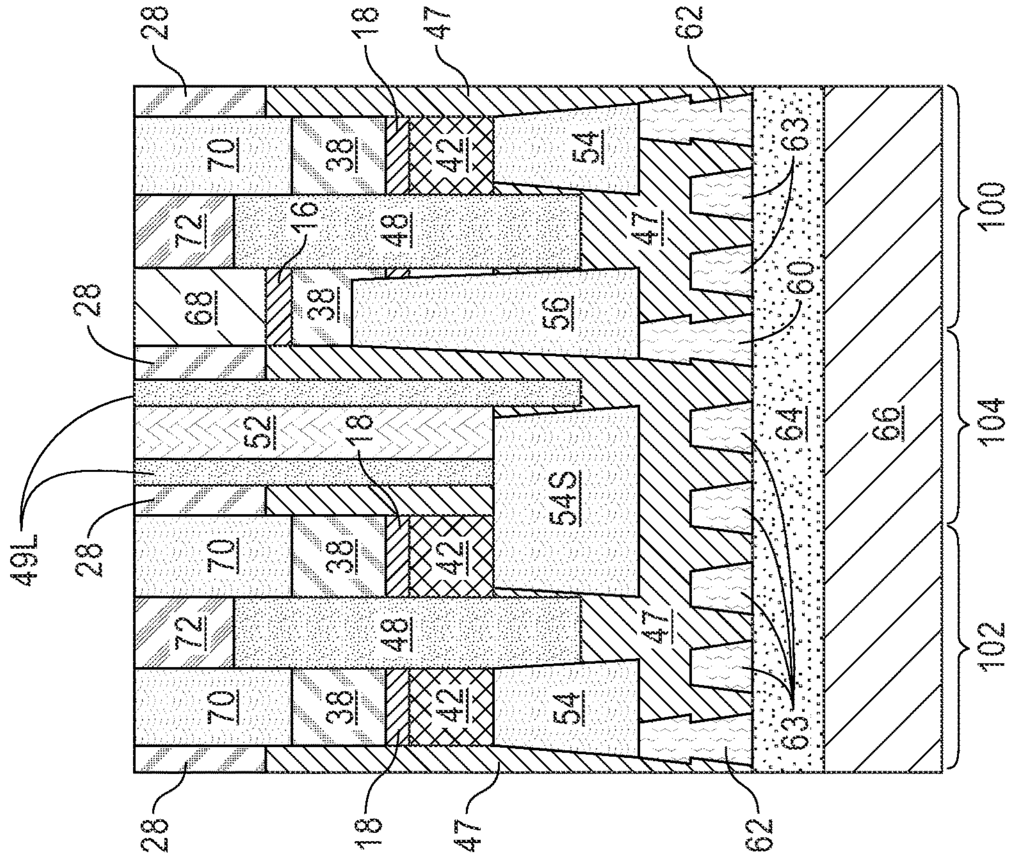
Figure 12B:
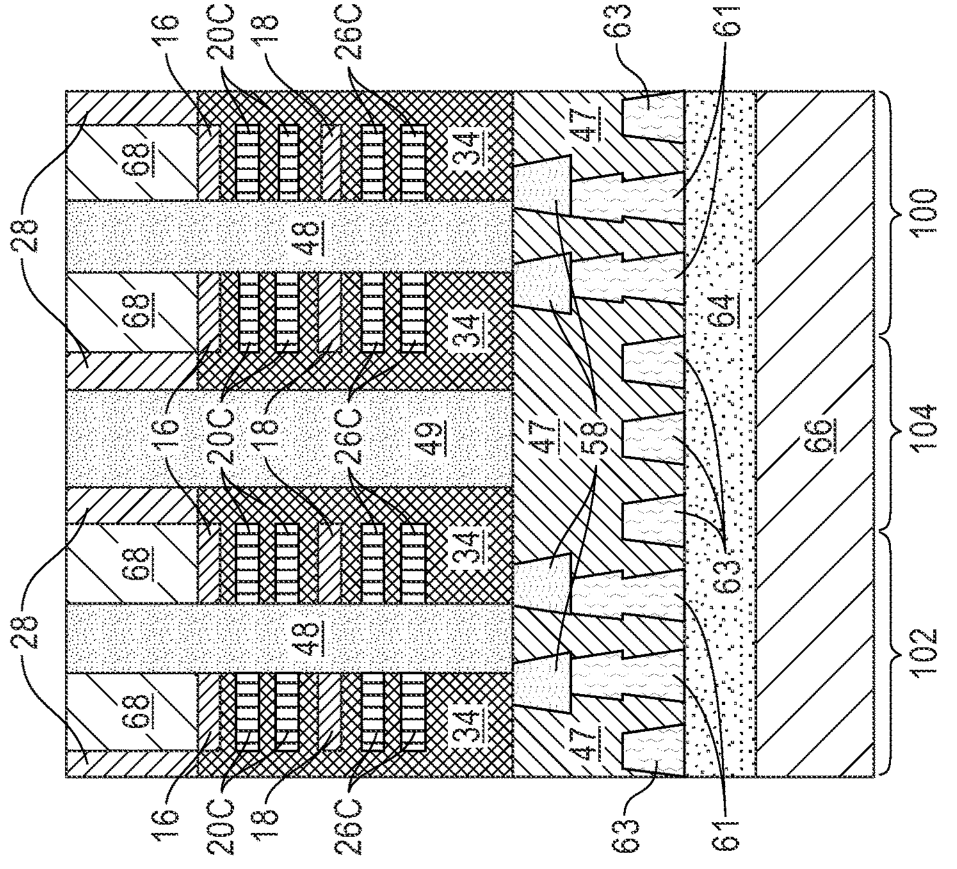

Referring now to FIGS. 12A, 12B and 12C, there are illustrated the exemplary structure shown in FIGS. 11A, 11B and 11C, respectively, after forming back side metal jumper structures 72. The back side metal jumper structures 72 are formed in the source/drain area of both the first active device region 100 and the second active device region 102 as is shown in FIG. 12C. The back side metal jumper structures 72 are composed of one of the electrically conductive materials above for the local interconnect structure 52. The back side metal jumper structures 72 can be formed by recessing (via a litho and recess etch) a physically exposed portion of the inter-device dielectric pillars 48 that are present in the source/drain area of both the first active device region 100 and the second active device region 102, followed by deposition of the electrically conductive material, and then planarization. Each back side metal jumper structure 72 is located on a surface of a remaining portion of one of the inter-device dielectric pillars 48 and has at least one sidewall that contacts a sidewall of one of the back side source/drain contact structures 70. The remaining inter-device dielectric pillars 48 in the source/drain area have a reduced vertical height as is shown in FIG. 12C.

Figure 13A:
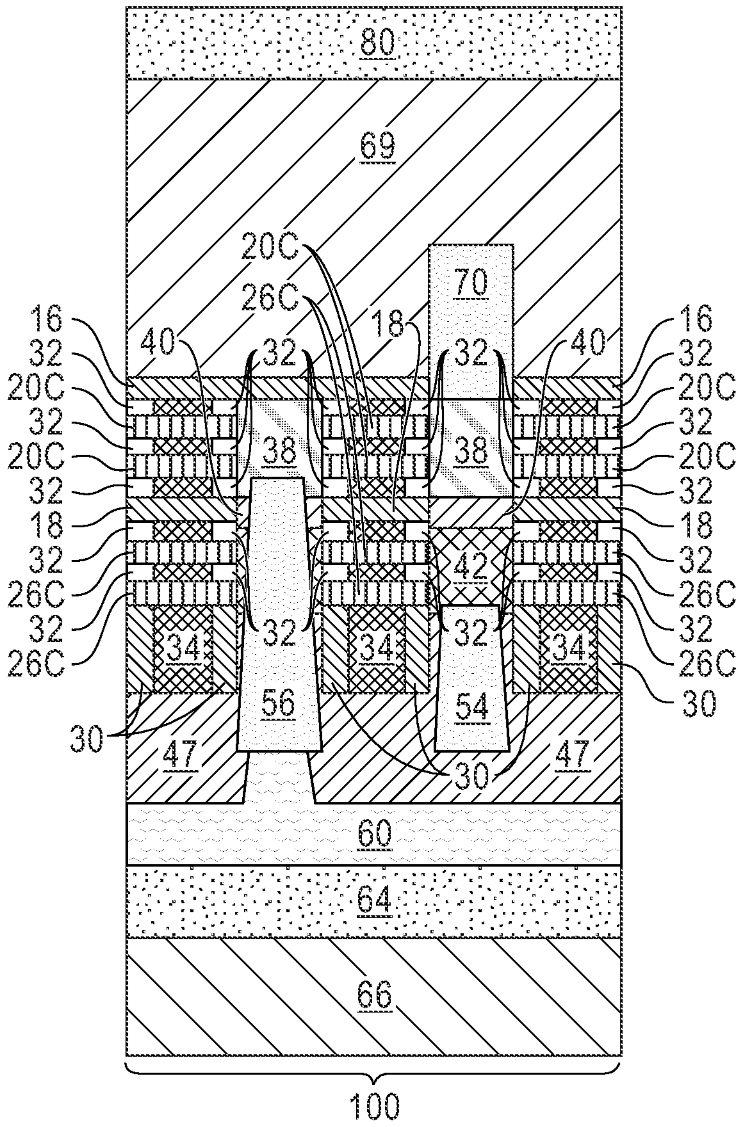
FIGS. 13A, 13B and 13C are cross sectional views of the exemplary structure shown in FIGS. 12A, 12B and 12C, respectively, after forming a second back side ILD material layer, forming back side electrically conductive structures including a back side power rail, and forming a back side power distribution network; in this embodiment the second source/drain region of one of the second FETs is wired to the back side power rail by the local interconnect structure.
Figure 13C:
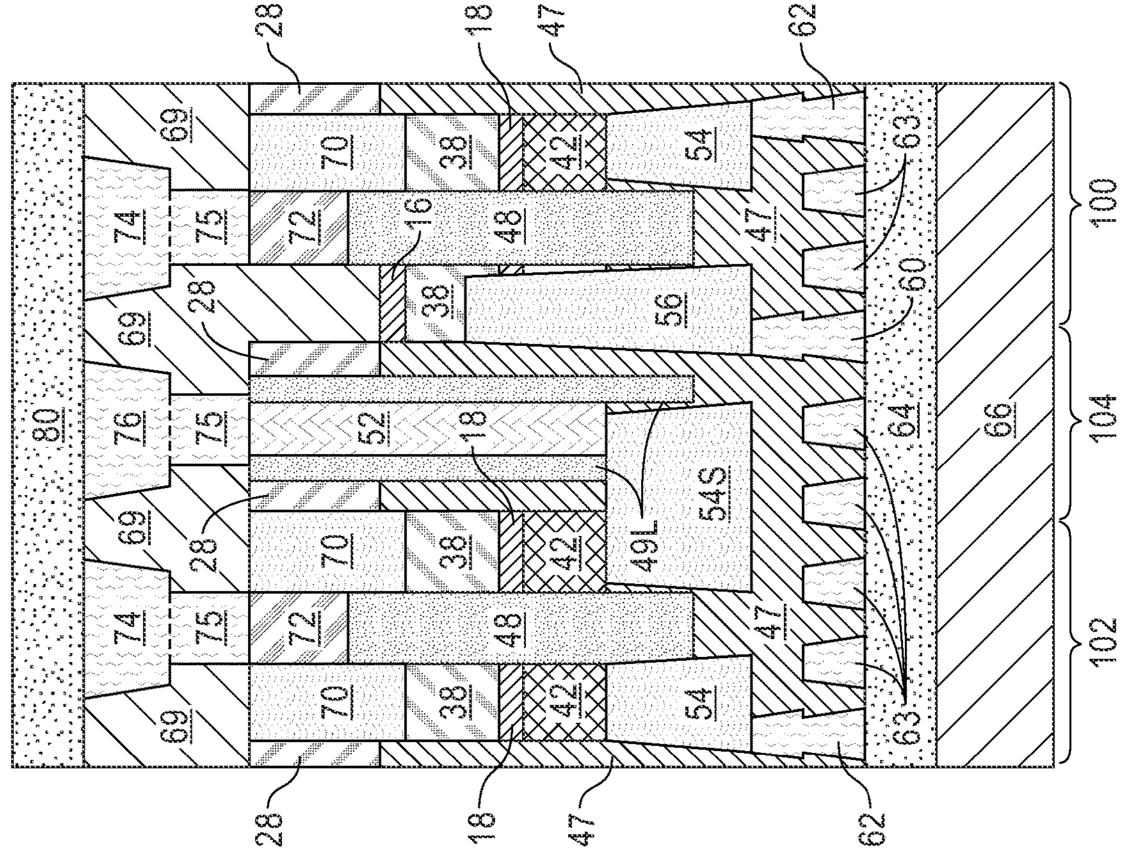
Figure 13B:
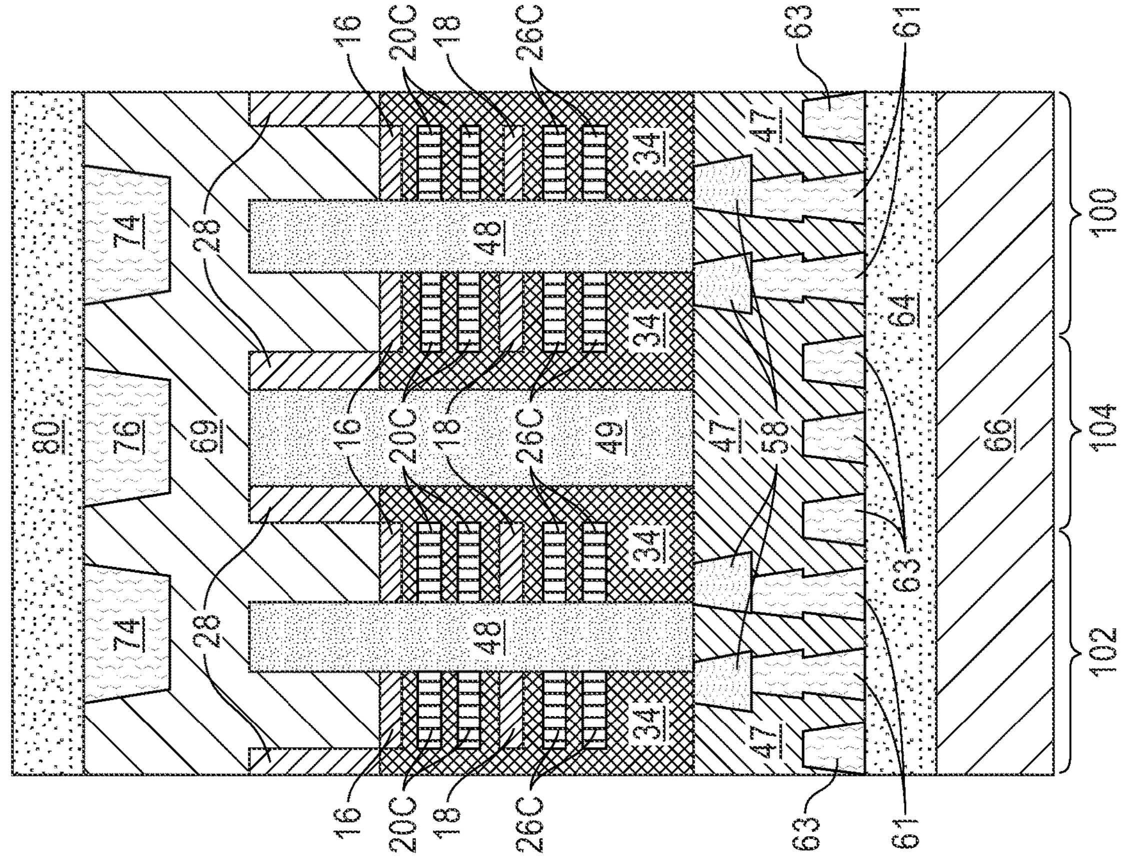

Referring now to FIGS. 13A, 13B and 13C, there are illustrated the exemplary structure shown in FIGS. 12A, 12B and 12C, respectively, after forming a second back side ILD material layer, forming back side electrically conductive structures 74, 75, 76, and forming a back side power distribution network 80. In the present application, the back side electrically conductive structure 74 is a back side power rail for VSS power supply (or VDD) that is in contact with the back side metal jumper structure 72 through a back side via 75 and the back side power distribution network 80, and the back side electrically conductive structure 76 is a back side power rail for VDD power supply (or VSS) that is connected to the local interconnect structure 52 and the back side power distribution network 80; in this embodiment the second source/drain region 42 is connected to the back side power rail (i.e., electrically conductive structure 76), by the local interconnect structure 52 through the front side contact extension structure 54S.

The second back side ILD material layer and the first back side ILD material layer 68 collectively form a back side ILD material multilayered stack 69. The second back side ILD material layer includes one of the dielectric materials mentioned above for the first front side ILD material layer 44. The second back side ILD material layer can be compositionally the same as, or compositionally different from, the first back side ILD material layer 68. The second back side ILD material layer can be formed utilizing one of the deposition processes mentioned above in forming the second front side ILD material layer.

The back side electrically conductive structures 74, 75, 76 are then formed by forming contact openings in the back side ILD material multilayered stack 69, filling those openings with an electrically conductive material, and then planarizing the structure. The electrically conductive material can include an electrically conductive power rail material including, but not limited to, tungsten (W), cobalt (Co), ruthenium (Ru), aluminum (Al), copper (Cu), platinum (Pt), rhodium (Rh), or palladium (Pd) with a thin metal adhesion layer, such as TiN, TaN, etc.

After forming the back side electrically conductive structures 74,75, 76, the back side power distribution network 80 is formed on top of the back side ILD material multilayered stack 69. The back side power distribution network 80 includes elements/components that are configured to distribute power to the stacked fork sheet devices.

FIGS. 13A, 13B and 13C illustrate one exemplary semiconductor structure of the present application; the description that follows rotates the structure by 180°. Notably, FIGS. 13A, 13B and 13C illustrate a semiconductor structure that includes a first pair of stacked devices (e.g., FS1 and FS2 as defined above) located in first active device region 100, and a second pair of stacked devices (e.g., FS1 and FS2 as defined above) located in second active device region 102. In the first active device region 100, FS1 and FS2 are separated by a first inter-device dielectric pillar (i.e., inter-device dielectric pillar 48 located in first active device region 100) and in the second active device region FS1 and FS2 are separated by a second inter-device dielectric pillar (i.e., inter-device material pillar 48 located in the second active device region 102). FS1 and FS2 include second FET (i.e., FET_2) stacked over first FET (i.e., FET_1). Thus in the present application for FETs are present in each device region. The structure further includes local interconnect structure 52 located in non-active device region 104 that is positioned between first active device region 100 and second active device region 102. In this embodiment, local interconnect structure 52 is connected to back side power distribution network 80 (by back side via 75 and a back side power rail (i.e., back side electrically conductive structure 76)) and to source/drain region 42 (by front side contact extension structure 54S) of second FET (i.e., FET_2) of the second pair of stacked devices that is located on a first side of the second inter-device dielectric pillar (i.e., inter-device material pillar 48 located in the second active device region 102) that is closest to the non-active device region 104.

Figure 14:
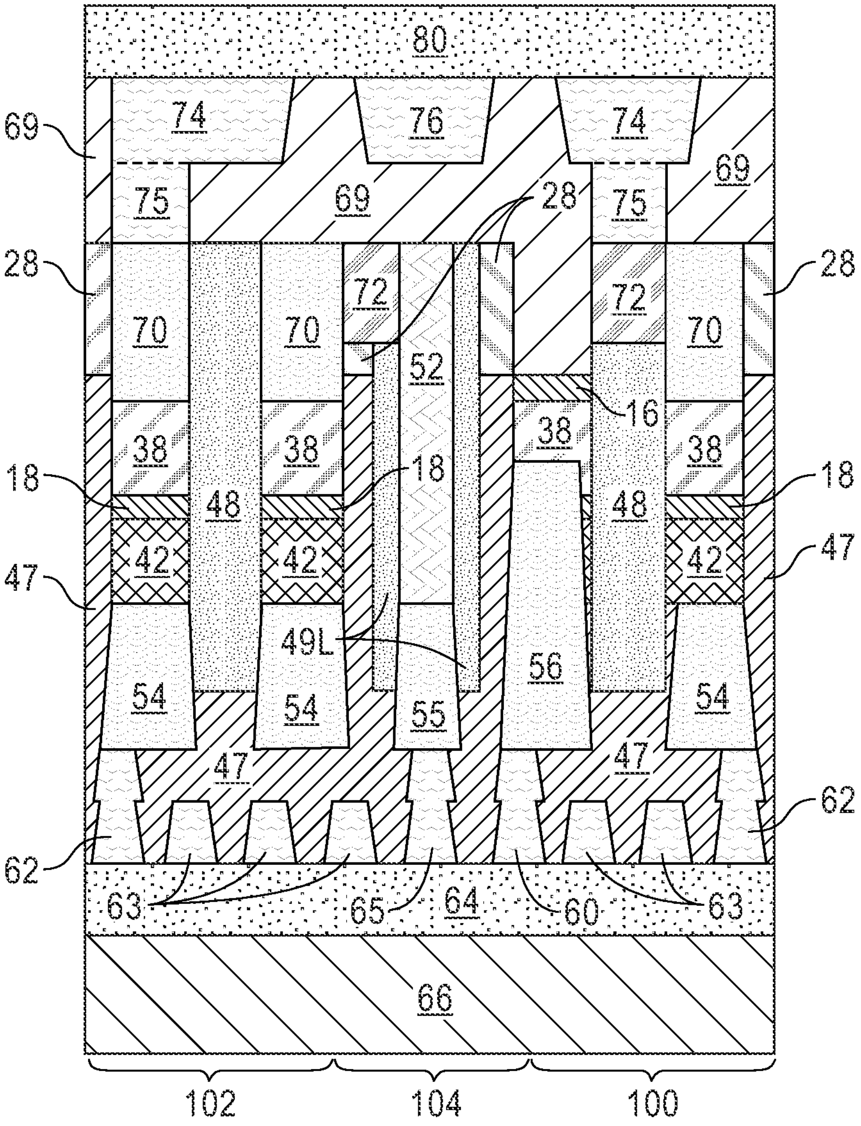
FIG. 14 is a cross sectional view of another exemplary structure through Y2-Y2 shown in FIG. 1 in which the first source/drain region of one of the first FETs is wired to a front side single line.

Referring now to FIG. 14, there is illustrated another exemplary structure through Y2-Y2 shown in FIG. 1 in which the first source/drain region 38 is connected to a front side signal line 65; signal line 65 is a lowest BEOL (M1) wire that in this embodiment contacts the local interconnect structure 52 by means of a MOL contact structure 55. The exemplary structure shown in FIG. 14 can be formed utilizing the basic process steps mentioned above in forming the exemplary structure shown in FIGS. 13A, 13B and 13C with modifications that are readily apparent to those skilled in the art to provide the electrically connections shown in FIG. 14.

Notably, FIG. 14 illustrates another exemplary structure of the present application; the description that follows rotates the structure by 180°. Notably, FIG. 14 illustrates a semiconductor structure includes a semiconductor structure that includes a first pair of stacked devices (e.g., FS1 and FS2 as defined above) located in first active device region 100, and a second pair of stacked devices (e.g., FS1 and FS2 as defined above) located in second active device region 102. In the first active device region 100, FS1 and FS2 are separated by a first inter-device dielectric pillar (i.e., inter-device dielectric pillar 48 located in first active device region 100) and in the second active device region FS1 and FS2 are separated by a second inter-device dielectric pillar (i.e., inter-device material pillar 48 located in the second active device region 102). FS1 and FS2 include second FET (i.e., FET_2) stacked over first FET (i.e., FET_1). The structure further includes local interconnect structure 52 located in non-active device region 104 that is positioned between first active device region 100 and second active device region 102. In this embodiment, local interconnect structure 52 is connected to front side signal line 64 (by MOL contact structure 55) and to source/drain region 38 (by back side metal jumper structure 72) of the first FET, (i.e., FET_1) of the second pair of stacked devices that is located on a first side of the second inter-device dielectric pillar (i.e., inter-device material pillar 48 located in the second active device region 102). that is closest to the non-active device region 104. In this embodiment, the semiconductor structure further includes back side power distribution network 80 connected to a source/drain region 38 (by back side source/drain contact structure 70) of the first FETs of the second pair of stacked devices that is located on a second side of the second inter-device dielectric pillar that is farthest from the non-active device region 104

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a first pair of stacked devices that are located in a first active device region, wherein the first pair of stacked devices are separated by a first inter-device dielectric pillar and each stacked device of the first pair of stacked devices comprises a second field effect transistor (FET) stacked over a first FET;

a second pair of stacked devices that are located in a second active device region, wherein the second pair of stacked devices are separated by a second inter-device dielectric pillar and each stacked device of the second pair of stacked devices comprises a second FET stacked over a first FET; and a local interconnect structure located in a non-active device region that is positioned between the first active device region and the second active device region, wherein the local interconnect structure is connected to a back side power distribution network and to a source/drain region of the second FET of the second pair of stacked devices that is located on a first side of the second inter-device dielectric pillar that is closest to the non-active device region.

2. The semiconductor structure of claim 1, wherein the local interconnect structure is connected to the back side power distribution network by a back side via and a back side power rail.

3. The semiconductor structure of claim 2, wherein the local interconnect structure is connected to the source/drain region of the second FET of the second stacked device that is located on the first side of the second inter-device dielectric pillar by a front side extension contact structure.

4. The semiconductor structure of claim 3, further comprising a local interconnect dielectric material liner laterally surrounding the local interconnect structure.

5. The semiconductor structure of claim 4, wherein the local interconnect dielectric material liner that is present on one side sidewall of the local interconnect structure that is closest to the second active device region has a vertical height that is less than a vertical height of the local interconnect dielectric material liner that is present on another side of the local interconnect structure that is closest to the first active device region.

6. The semiconductor structure of claim 5, wherein the local interconnect dielectric material liner that has a lesser vertical height contacts a surface of the front side extension contact structure.

7. The semiconductor structure of claim 1, further comprising a back side metal jumper structure contacting a surface of the second inter-device dielectric pillar in the second active device region, wherein the back side metal jumper structure is connected to a source/drain region of the first FET of the second pair of stacked devices that is on the first side of the inter-device dielectric pillar that is closest to the non-active device region and to a source/drain region of the first FET of the second pair of stacked devices that is on a second side of the second inter-device dielectric pillar that is located furthest from the non-active device region.

8. The semiconductor structure of claim 7, wherein the back side metal jumper structure is connected to the source/drain region of the first FET of the second pair of stacked devices that is on the first side of the second inter-device dielectric pillar by a first back side source/drain contact structure, and to the source/drain region of the first FET of the second pair of stacked devices that is on the second side of the inter-device dielectric pillar by a second back side source/drain contact structure.

9. The semiconductor structure of claim 1, further comprising a front side source/drain contact structure connecting a source/drain region of the second FET of the second pair of stacked devices located on a second side of the second inter-device dielectric pillar that is furthest from the non-active device region to a front side additional back-end-of-the-line (BEOL) structure.

10. The semiconductor structure of claim 9, further comprises a carrier wafer located on a surface of the front side additional BEOL structure.

11. The semiconductor structure of claim 1, wherein each of the first pair of stacked devices and the stacked pair of stacked devices comprise fork sheet devices comprising a functional gate structure wrapping around a plurality of semiconductor channel fork sheets.

12. A semiconductor structure comprising:

a first pair of stacked devices that are located in a first active device region, wherein the first pair of stacked devices are separated by a first inter-device dielectric pillar and each stacked device of the first pair of stacked devices comprises a second field effect transistor (FET) stacked over a first FET;

a second pair of stacked devices that are located in a second active device region, wherein the second pair of stacked devices are separated by a second inter-device dielectric pillar and each stacked device of the second pair of stacked devices comprises a second FET stacked over a first FET; and a local interconnect structure located in a non-active device region that is positioned between the first active device region and the second active device region, wherein the local interconnect structure is connected to a front side signal line and to a source/drain region of the first FET of the second pair of stacked devices that is located on a first side of the second inter-device dielectric pillar that is closest to the non-active device region.

13. The semiconductor structure of claim 12, further comprising a back side power distribution network connected to a source/drain region of the first FET of the second pair of stacked devices that is located on a second side of the second inter-device dielectric pillar that is farthest from the non-active device region.

14. The semiconductor structure of claim 12, wherein the local interconnect structure is connected to the front side signal line by a local interconnect contact structure.

15. The semiconductor structure of claim 12, wherein the local interconnect structure is connected to the source/drain region of the second FET of the second pair of stacked devices that is located on the first side of the second inter-device dielectric pillar by a back side metal jumper structure and a back side source/drain contact structure.

16. The semiconductor structure of claim 15, wherein the back side metal jumper structure contacts a sidewall of the local interconnect structure and a sidewall of the back side source/drain contact structure, the back side metal jumper structure is present on surface of a local interconnect dielectric material liner that laterally surrounds the local interconnect structure.

17. The semiconductor structure of claim 16, wherein the local interconnect dielectric material liner that has the back side metal jumper structure located thereon is present on a sidewall of the local interconnect structure that is closest to the second active device region.

18. The semiconductor structure of claim 17, wherein the local interconnect dielectric material liner that is present on the sidewall of the local interconnect structure that is closest to the second active device region has a vertical height that is less than a vertical height of the local interconnect dielectric material liner that is present on side of the local interconnect structure that is closest to the first active device region.

19. The semiconductor structure of claim 12, further comprising a front side source/drain contact structure connecting a source/drain region of the second FET of the second pair of stacked devices that is located on a second side of the second inter-device dielectric pillar that is furthest from the non-active device region to a front side additional back-end-of-the-line (BEOL) structure, and wherein a carrier wafer is located on a surface of the front side additional BEOL structure.

20. The semiconductor structure of claim 12, wherein the first FET comprises a plurality of spaced apart first semiconductor channel material fork sheets extending outward from the inter-device dielectric pillar, and the second FET comprises a plurality of spaced apart second semiconductor channel material fork sheets extending outward from the inter-device dielectric pillar, and wherein a bottom dielectric isolation layer is located beneath the first FET, and a middle dielectric isolation layer is located between a bottommost second semiconductor channel material fork sheet and a topmost first semiconductor channel material fork sheet, and a functional gate structure wraps around each spaced apart second semiconductor channel material fork sheet, each spaced apart first semiconductor channel material fork sheet and the middle dielectric isolation layer.

* * * * *